United States Patent
Akaike et al.

(10) Patent No.: US 8,524,622 B2
(45) Date of Patent: Sep. 3, 2013

(54) SKIN MATERIAL OF VEHICLE INTERIOR EQUIPMENT AND MANUFACTURING METHOD FOR THE SAME

(75) Inventors: Fumitoshi Akaike, Miyoshi (JP); Kohei Kato, Chiryu (JP); Shigehiro Fujita, Ichinomiya (JP); Takazo Fujii, Obu (JP); Hideaki Kunisada, Komaki (JP)

(73) Assignee: Toyota Boshoku Kabushiki Kaisha, Aichi-Ken (JP)

( * ) Notice: Subject to any disclaimer, the term of this patent is extended or adjusted under 35 U.S.C. 154(b) by 277 days.

(21) Appl. No.: 12/757,198

(22) Filed: Apr. 9, 2010

(65) Prior Publication Data

US 2010/0258334 A1 Oct. 14, 2010

(30) Foreign Application Priority Data

Apr. 10, 2009 (JP) .................. 2009-095652
Jul. 29, 2009 (JP) .................. 2009-176282
Dec. 9, 2009 (JP) .................. 2009-279307

(51) Int. Cl.
*D03D 15/00* (2006.01)

(52) U.S. Cl.
USPC ........... 442/229; 442/185; 442/228; 442/232; 442/233; 442/234; 442/238; 442/239; 442/243

(58) Field of Classification Search
USPC ................. 442/185, 228, 229, 232, 233, 234, 442/238, 239, 243
See application file for complete search history.

(56) References Cited

U.S. PATENT DOCUMENTS

| 3,616,138 | A | * | 10/1971 | Wentworth | ................. 428/96 |
| 4,153,749 | A | * | 5/1979 | Klein | ................. 428/95 |
| 4,889,963 | A | * | 12/1989 | Onai | ................. 174/129 R |
| 5,900,587 | A | * | 5/1999 | Piper et al. | ................. 174/117 F |
| 6,222,126 | B1 | * | 4/2001 | Strange et al. | ................. 174/70 R |
| 2009/0324901 | A1 | | 12/2009 | Hashiba et al. | |

FOREIGN PATENT DOCUMENTS

| JP | 2000-219076 | 8/2000 |
| JP | 2004-033730 | 2/2004 |
| JP | 2006-234716 | 9/2006 |
| JP | 2006-332647 | 12/2006 |
| JP | 2007-227384 | 9/2007 |

OTHER PUBLICATIONS

U.S. Appl. No. 12/815,450 to Masanori Hashiba et al., filed Jun. 15, 2010.
Japanese Official Action, mail date Jun. 25, 2013.

* cited by examiner

*Primary Examiner* — Andrew Piziali
(74) *Attorney, Agent, or Firm* — Greenblum & Bernstein, P.L.C.

(57) ABSTRACT

In a skin material of vehicle interior equipment, which includes a first fabric material that is formed of a first conductive wire material and a main fiber material weaker than the first conductive wire material, and a manufacturing method for the skin material, part of the main fiber material is removed from the first fabric material, and a conductive member, which is used to supply electric power to the conductive wire material, is electrically connected to the exposed first conductive wire material.

9 Claims, 27 Drawing Sheets

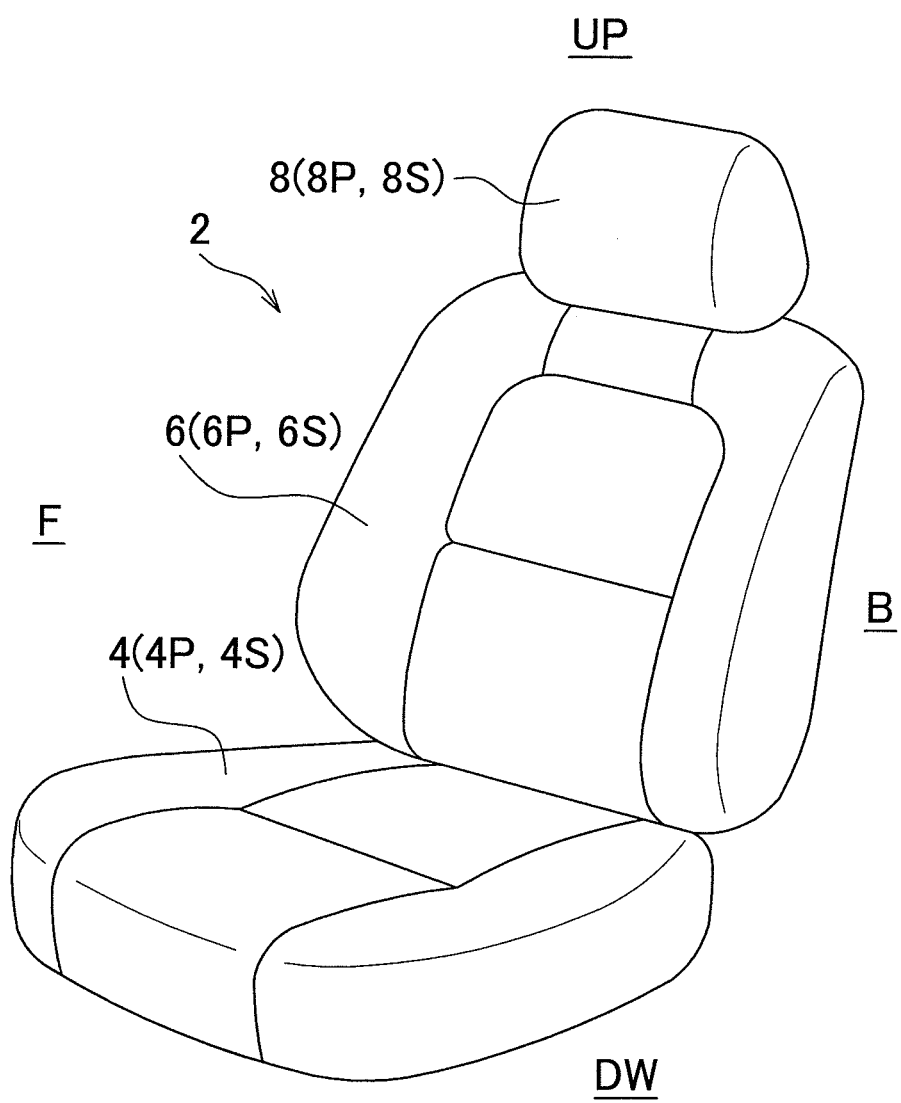

F I G . 10C
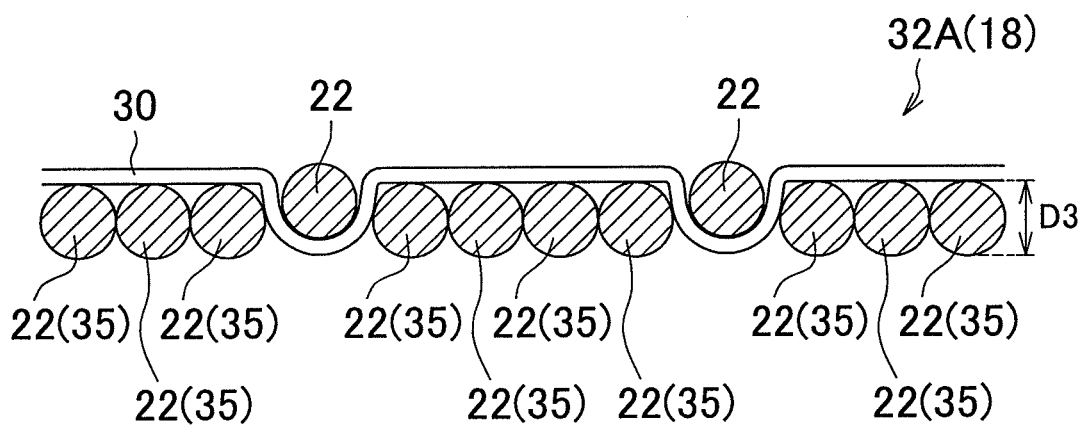
F I G . 10D
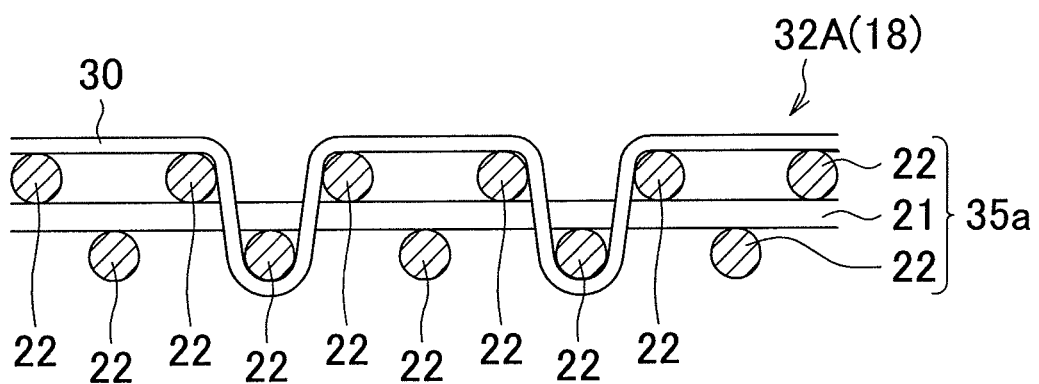

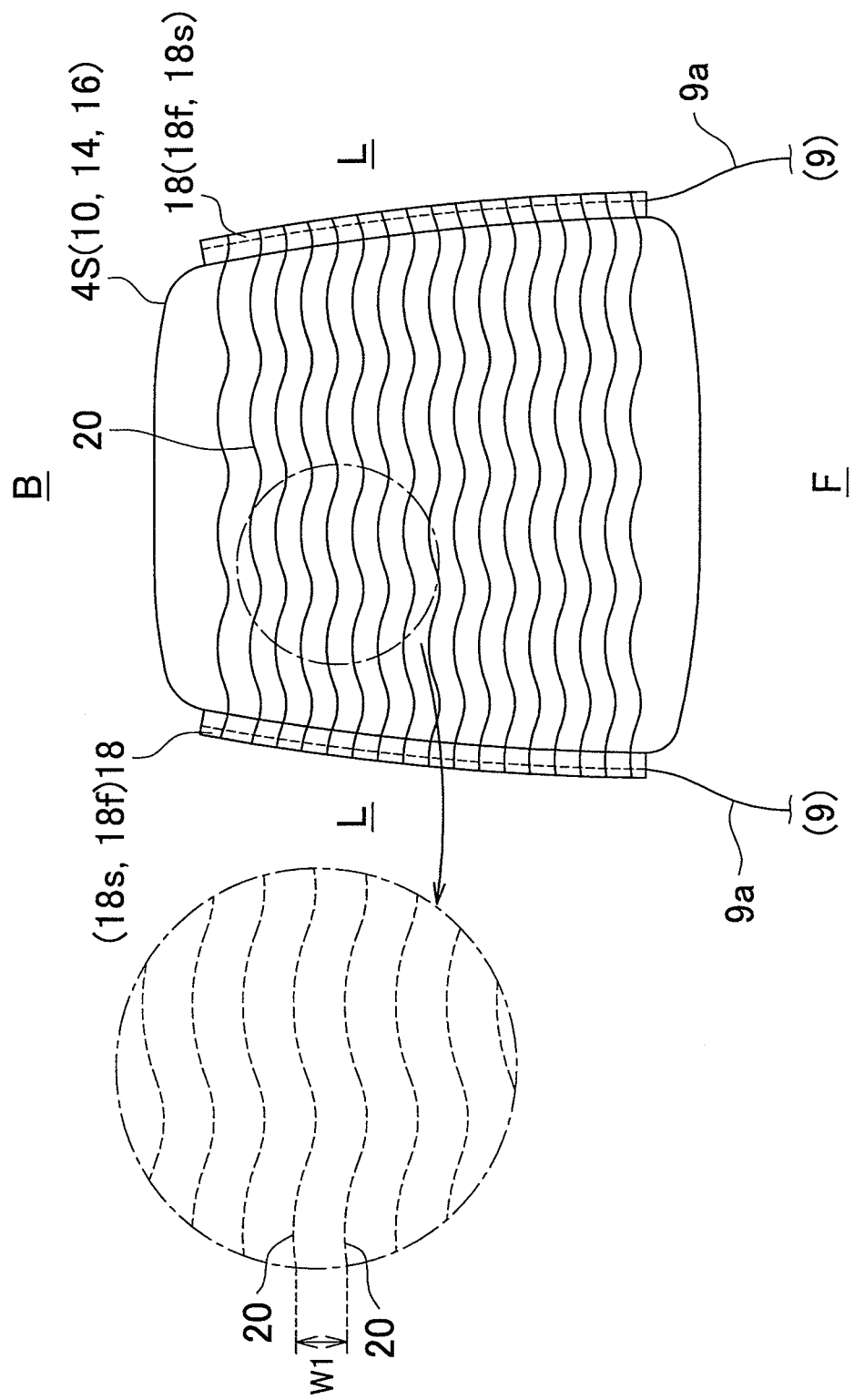

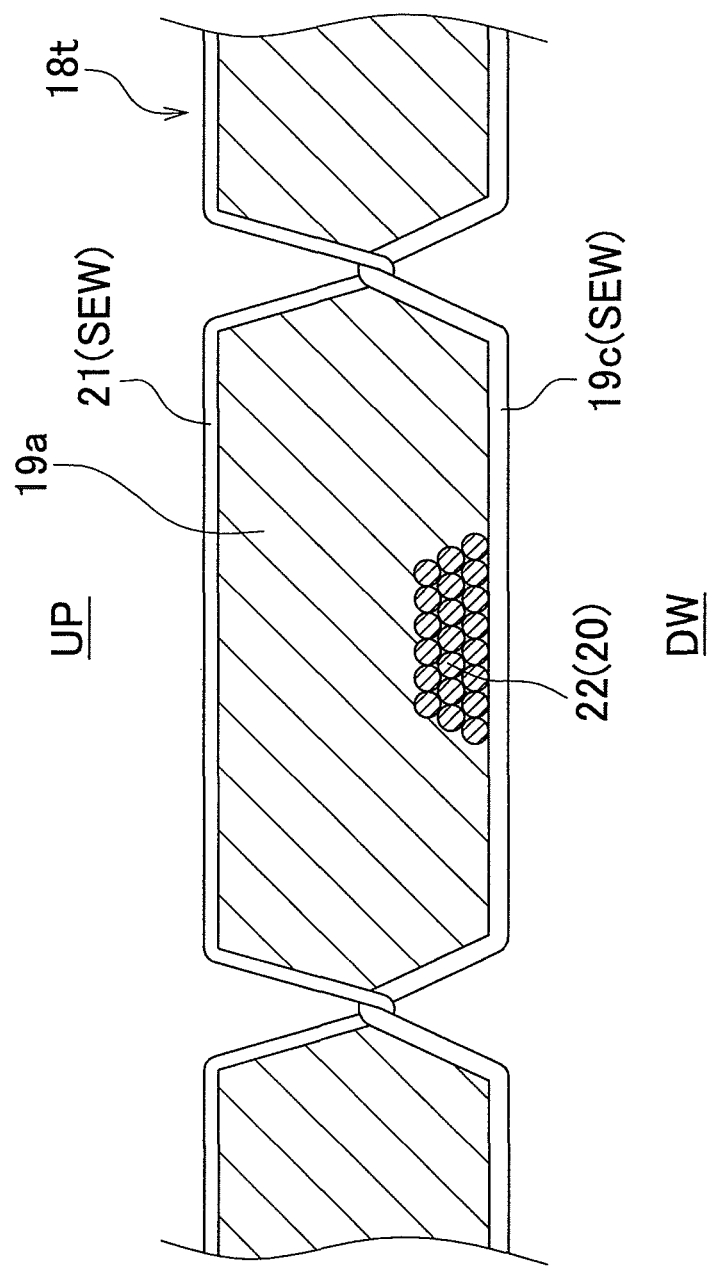

SKIN MATERIAL OF VEHICLE INTERIOR EQUIPMENT AND MANUFACTURING METHOD FOR THE SAME

INCORPORATION BY REFERENCE

The disclosures of Japanese Patent Application No. 2009-95652 filed on Apr. 10, 2009, Japanese Patent Application No. 2009-176282 filed on Jul. 29, 2009 and Japanese Patent Application No. 2009-279307 filed on Dec. 9, 2009 including the specifications, drawings and abstracts are incorporated herein by reference in its entirety.

BACKGROUND OF THE INVENTION

1. Field of the Invention

The invention relates to a conductive skin material of vehicle interior equipment and a manufacturing method for the same.

2. Description of the Related Art

For example, Japanese Patent Application Publication No. 2006-234716 (JP-A-2006-234716) describes a woven fabric that has a conductive wire material and a conductive member that is able to conduct electric power to the conductive wire material. The conductive wire material is formed of a conductive fiber, such as a stainless fiber and a carbon fiber, and a layer of a nonconductive fiber (insulating layer, such as cotton and polyester) that coats the conductive fiber. Then, the conductive wire material is used as warp yarn and weft yarn to weave a woven fabric, and then the conductive member is electrically connected to a connected portion of the conductive wire material. The intersections of the warp yarn and the weft yarn function as capacitors because of an intervening insulating layer between the adjacent conductive fibers. This woven fabric may be, for example, used as a skin material of a vehicle seat. Then, the capacitances of the intersections (capacitors) are measured while the woven fabric, which serves as the skin material, is supplied with current. By so doing, it is possible to detect the presence, or the like, of an occupant on the seat.

Incidentally, in the technique described in JP-A-2006-234716, the conductive wire material is coated with the insulating layer. For this reason, it is necessary to remove the insulating layer from the connected portion of the conductive wire material before the conductive member is connected to the connected portion, so connecting work for the conductive member may take time. Then, Japanese Patent Application Publication No. 2007-227384 (JP-A-2007-227384) describes a woven fabric that is usable as a heater. This woven fabric is formed of nonconductive thread (main fiber material, such as an insulating fiber) and conductive thread (conductive wire material). The nonconductive thread serves as a major component. This conductive thread is a conductive wire material that is able to generate heat when supplied with current. The conductive thread is, for example, made of metal, alloy, a conductor made of a conductive plastic, or a carbon fiber. Then, the conductive wire material is used for part of warp yarn or weft yarn to weave a woven fabric, and then a conductive member is electrically connected to a connected portion of the conductive wire material. At this time, the conductive member is thermally welded or stuck to the woven fabric. Thus, the conductive wire material may be directly connected to the conductive member.

However, in the related art, for example, the nonconductive thread, which serves as a major component of the woven fabric, interferes with contact between the conductive wire material and the conductive member, so connectivity between the conductive wire material and the conductive member may deteriorate.

SUMMARY OF THE INVENTION

The invention electrically connects a conductive member to a conductive wire material with good connectivity by further simple connecting work.

A first aspect of the invention provides a skin material of vehicle interior equipment, which includes a first conductive wire material and a first fabric material that is formed of a main fiber material weaker than the first conductive wire material, and a manufacturing method for the skin material. In the skin material of the vehicle interior equipment, a conductive member, which is used to supply electric power to the first conductive wire material, is electrically connected to the first conductive wire material exposed from the first fabric material.

According to the first aspect of the invention, it is possible to electrically connect a conductive member to a conductive wire material with good connectivity by further simple connecting work.

BRIEF DESCRIPTION OF THE DRAWINGS

The foregoing and further objects, features and advantages of the invention will become apparent from the following description of example embodiments with reference to the accompanying drawings, wherein like numerals are used to represent like elements and wherein:

FIG. 1 is a perspective view of a vehicle seat;
FIG. 10C is a longitudinal cross-sectional view that shows another pressing member and the conductive member;

FIG. 10D is a longitudinal cross-sectional view that shows further another pressing member and the conductive member;

FIG. 17A is a partially see-through front view of a rear surface of a skin material according to a third embodiment;

FIG. 17B is a partial enlarged view of the rear surface of the skin material according to the third embodiment;

FIG. 27 is a longitudinal cross-sectional view of a conductive member and a conductive wire material according to the third example embodiment of the third embodiment.

DETAILED DESCRIPTION OF EMBODIMENTS

Figure 2A:
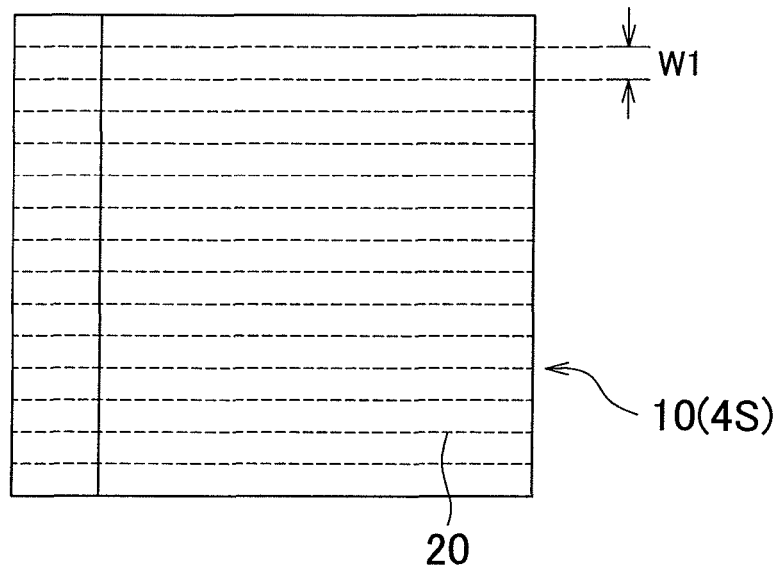
FIG. 2A is a front view of a skin material.

Hereinafter, embodiments of the invention will be described with reference to FIG. 1 to FIG. 28. In each of the drawings, for the sake of convenience, reference numerals may possibly be assigned to only a portion of conductive wire materials. Then, in each of the drawings, where appropriate, a reference sign F is assigned to indicate the front side of a vehicle seat, a reference sign B is assigned to indicate the rear side of the vehicle seat, a reference sign UP is assigned to indicate the upper side of the vehicle seat and a reference sign DW is assigned to indicate the lower side of the vehicle seat.

A vehicle seat 2 shown in FIG. 1 includes a seat cushion 4, a seat back 6 and a head rest 8. These members respectively have cushioning materials (4P, 6P and 8P) and skin materials (4S, 6S and 8S) (see FIG. 4). The cushioning materials (4P, 6P and 8P) form the outer shape of the seat. The skin materials (4S, 6S and 8S) cover the cushioning materials. Then, in each of the embodiments, the skin material 4S of the seat cushion 4 is formed of a fabric material 10 (described in detail later) having a plurality of conductive wire materials 20 (see FIG. 2A and FIG. 2B). The fabric material 10 functions as electrodes of a capacitance sensor or a heater in such a manner that a conductive member 18 is electrically connected to the plurality of conductive wire materials 20. Then, it is desired to connect the conductive wire materials 20 to the conductive member 18 with good connectivity (see FIG. 3A to FIG. 3D). Furthermore, it is also desired to attach the conductive member 18 to the skin material 4S with good storability. Then, in each of the embodiments, processes (simple connecting work), which will be described later, are employed to electrically connect the conductive member 18 to the conductive wire materials 20 with good connectivity or good storability, without adversely influencing the characteristics of the skin material 4S as much as possible.

In the first embodiment, the fabric material 10, which forms the skin material 4S, is made (upstream process), and then the conductive member 18 is electrically connected to the conductive wire materials 20 in the following two processes (see FIG. 2A to FIG. 3D). First Process: A splitting device is used to remove main fiber materials from the fabric material 10 to thereby split the fabric material 10 into a fabric material body 10b and a fabric material piece 10f. Then, the conductive wire materials 20 are exposed from a split portion 22a (an example of a split portion) formed between the fabric material body 10b and the fabric material piece 10f. Second Process: The conductive member 18 is electrically connected to the plurality of conductive wire materials 20 exposed from the split portion 22a while the fabric material body 10b and the fabric material piece 10f are used to maintain the relative positional relationship among the plurality of conductive wire materials 20.

In the upstream process, the conductive wire materials 20 and the main fiber materials are used to create the fabric material 10. The fabric material 10 may be any one of a woven fabric, a knit fabric and a nonwoven fabric. In addition, as will be described later, when the fabric material 10 forms the skin material 4S, a pad material 12 or a backing fabric may be used where appropriate (see FIG. 4). Hereinafter, the components will be described in detail.

The main fiber material is weaker than the conductive wire material 20 (described later), and may be used as the main component of the fabric material 10 (see FIG. 2A and FIG. 2B). For example, the main fiber material is desirably a wire material having a low strength, a meltable wire material, an inflammable wire material or a wire material having a poor chemical resistance as compared with the conductive wire material 20. The material of the main fiber material may be, for example, a plant or animal natural fiber, a chemical fiber made of thermoplastic resin or thermosetting resin, or a blended fiber of them. Then, a wire material (filament, spun yarn, or the like) made of insulating fibers may be used as the component of the fabric material 10.

The above described insulating fiber is mostly weaker (for example, poorer in strength) than the conductive wire material 20. A general natural fiber is more inflammable than the conductive wire material 20. Then, the protein, which is the main component of a natural fiber, may be relatively easily degraded or weakened by a chemical agent, such as a protease and a denaturant (acid or base). Then, a general chemical fiber tends to have a lower melting point or more inflammable than the conductive wire material 20. In addition, a chemical fiber may be relatively easily degraded or weakened by a chemical agent, such as an organic solvent.

Figure 2B:
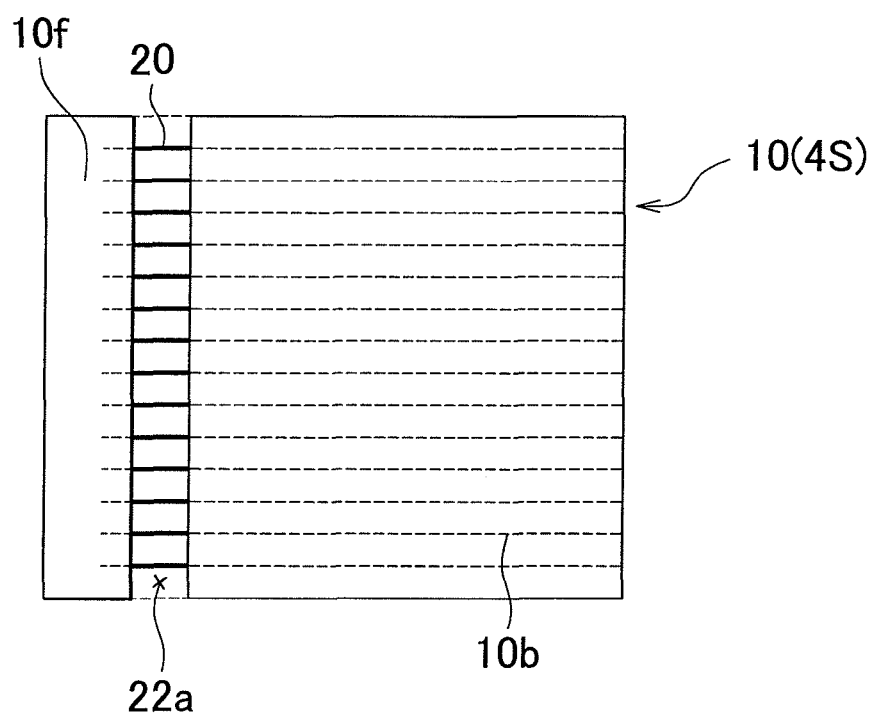
FIG. 2B is a front view of the split skin material.
Figure 3A:
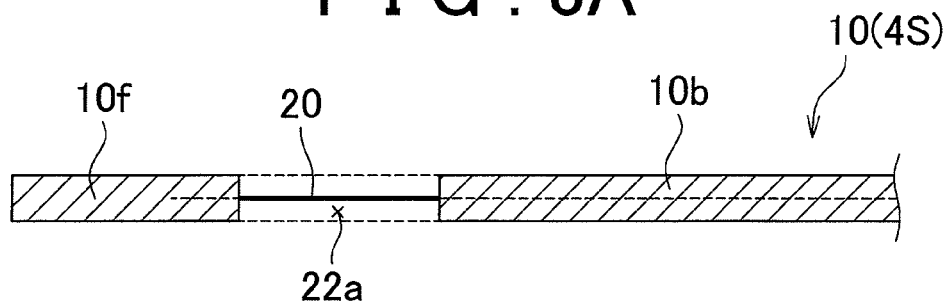
FIG. 3A is a longitudinal cross-sectional view of the skin material.
Figure 3B:
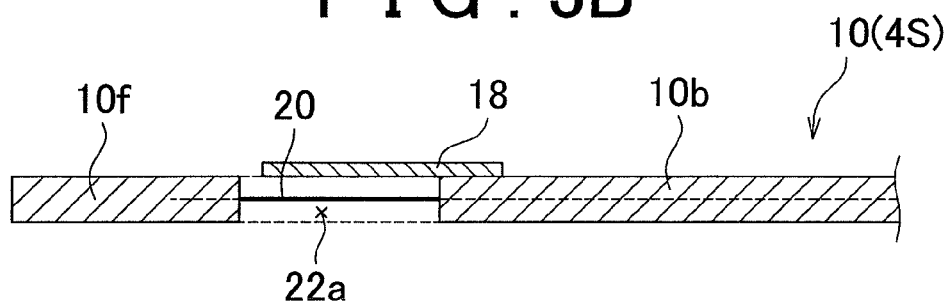
FIG. 3B is a longitudinal cross-sectional view of the skin material and a conductive member.
Figure 3C:
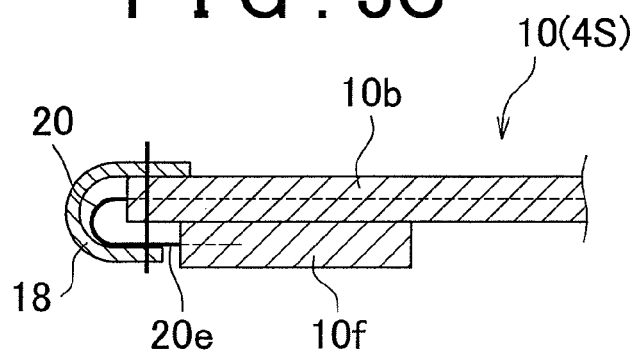
FIG. 3C is another longitudinal cross-sectional view of the skin material and the conductive member.
Figure 3D:
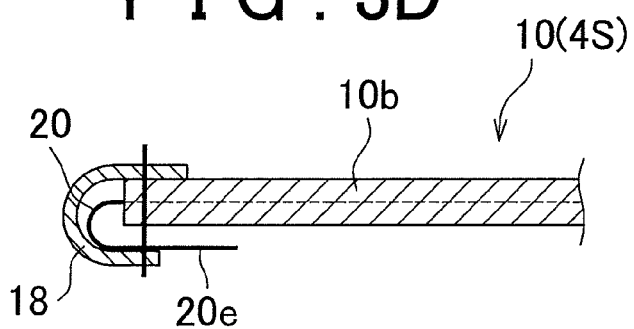
FIG. 3D is further another longitudinal cross-sectional view of the skin material and the conductive member.

Each conductive wire material 20 is able to conduct current (see FIG. 2A and FIG. 2B). By attaching the conductive wire materials 20 to the fabric material 10, the fabric material 10 itself may be used as electrodes of a capacitance sensor or a heater. The above described conductive wire material 20 may be, for example, conductive thread, such as metal and alloy, a filament of a carbon fiber or plated nonconductive thread (plated wire material). Here, the carbon fiber is a polyacrylonitrile-based carbon fiber (PAN-based carbon fiber) or a pitch-based carbon fiber. Among others, a carbon fiber having a firing temperature of 1000° C. or above (a carbonized fiber, a graphitized fiber or a graphite fiber) has a high electroconductivity, so the carbon fiber may be suitably used as the conductive wire material 20 according to the present embodiment.

Then, each conductive wire material 20 is desirably a wire material having a higher strength, a wire material having a higher melting point, a wire material having a flame resistance or a wire material having a high chemical resistance as compared with the main, fiber material. For example, the conductive wire material 20 made of any of a metal, an alloy and a carbon fiber has an excellent rigidity, and mostly has a higher strength than the above described insulating fiber. In addition, conductive thread and a plated wire material typically tend to have a higher melting point than the insulating fiber or tend to have a higher flame resistance than the insulating fiber. Then, conductive thread and a plated wire material are resistant to a typical protease and a typical resin dissolving agent. Then, a carbon fiber (a PAN-based carbon fiber or a pitch-based carbon fiber) is not meltable, and typically has a higher flame resistance than a natural fiber or a synthetic fiber. In addition, a carbon fiber is resistant to a typical protease and a typical resin dissolving agent.

In the present embodiment, part of the fabric material 10 is formed of the plurality of conductive wire materials 20. Then, the other part of the fabric material 10 is formed of the main fiber materials that are weaker than the conductive wire materials 20. Here, the plurality of conductive wire materials 20 are desirably arranged parallel to one another in the fabric material 10. For example, the conductive wire materials 20 are arranged in the fabric material 10 in a linear manner or in a wavy manner. Note that the interval (W1) between the adjacent conductive wire materials 20 is not specifically limited; however, the interval (W1) may be typically set to fall within the range of 5 mm to 50 mm. Here, the interval (W1) may be smaller than 5 mm; however, in this case, the number of the conductive wire materials 20 increases more than necessary and, as a result, cost increases. When the interval (W1) is longer than 50 mm, the conductive wire materials 20 in the fabric material 10 are sparse. This tends to deteriorate sensor function or heater function.

For example, when a woven fabric is made as the fabric material 10, the conductive wire material 20 is used for part of weft yarn and warp yarn, and the main fiber material (insulating fiber) is used for the other part of weft yarn and warp yarn. When a knit fabric is made as the fabric material 10, the conductive wire material 20 is used for part of yarn in a wale direction or yarn in a course direction, and the main fiber material (insulating fiber) is used for the other part of the yarn. Then, when a nonwoven fabric is made as the fabric material 10, for example, a web is formed by blending the conductive wire material 20 and the main fiber material (typically, both are short fibers), and then the web is interlaced to form a nonwoven fabric.

Figure 4:
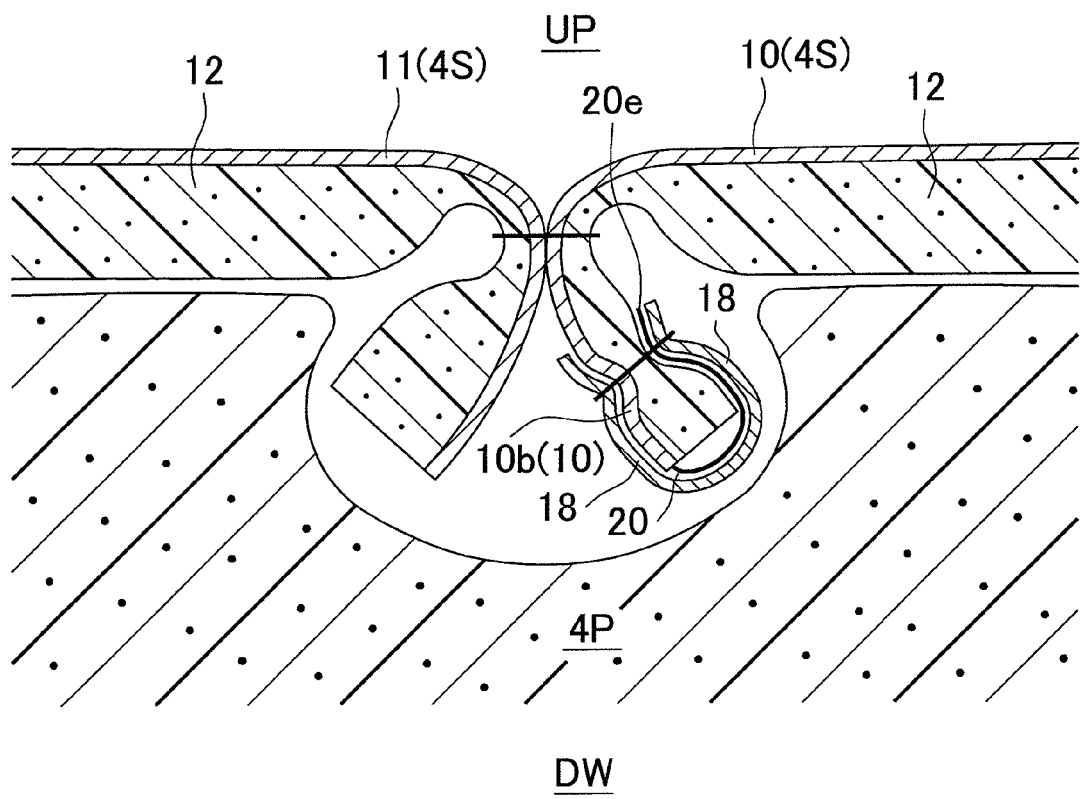
FIG. 4 is a longitudinal cross-sectional view of part of a seat cushion.

Here, when the fabric material 10 forms the skin material 4S, backing is provided for (a resin layer is formed on) the back surface of the fabric material 10 in consideration of seating performance of the seat, and then the pad material 12 or the backing fabric (not shown) may be arranged (see FIG. 4). The pad material 12 is a flexible porous member, and may be, for example, an urethane pad or a flexible urethane foam. In addition, the backing fabric may be, for example, formed of woven and knit fabrics or a nonwoven fabric (main fiber materials). Then, the fabric material 10, the pad material 12, and the like, are stacked in the stated order and integrated by a joining method, and then the integrated material is cut into a predetermined shape. The joining method may be, for example, laminating (welding), sewing, bonding, or the like.

In the first process, the splitting device (described later) is used to remove part of the main fiber materials from the fabric material 10 to thereby form a cut line at a side portion of the fabric material 10 (see FIG. 2A and FIG. 2B). At this time, the main fiber materials are cut by the splitting device; however, the conductive wire materials 20 are not cut but remain unchanged. Note that when the pad material 12 (a resin layer or a backing fabric) is provided for the fabric material 10, the pad material 12, or the like, is also desirably cut at the same time (see FIG. 4).

Then, the fabric material piece 10f is separated from the fabric material body 10b to split the fabric material 10 into the fabric material body 10b and the fabric material piece 10f. Then, the plurality of conductive wire materials 20 are exposed from the split portion 22a. At this time, one ends of the conductive wire materials 20 are fixed to the fabric material body 10b, and the other ends of the conductive wire materials 20 are fixed to the fabric material piece 10f. That is, the fabric material piece 10f serves as a jig for fixing the exposed conductive wire materials 20 (connected portion). Therefore, the relative arrangement (parallel arrangement) of the plurality of conductive wire materials 20 is maintained by the fabric material body 10b and the fabric material piece 10f.

Here, the splitting device removes only the main fiber materials as much as possible while leaving the conductive wire materials 20. The splitting device is appropriately selected in consideration of the characteristic difference between the conductive wire material 20 and the main fiber material. For example, in consideration of strength difference between both wire materials, a tool (cutter, scissors, or the like) that physically splits the fabric material 10 may be used as the splitting device. In addition, in consideration of the melting points and degrees of burning of both wire materials, an optical device, such as a laser, may be used as the splitting device. In addition, in consideration of the chemical resistances of both wire materials, various chemical agents may be used as the splitting device. Note that these splitting devices may be used in combination where appropriate.

In the second process, the fabric material body 10b and the fabric material piece 10f are used to maintain the relative positional relationship among the plurality of conductive wire materials 20, while the conductive member 18 is electrically connected to the plurality of conductive wire materials 20 exposed from the split portion 22a (see FIG. 3A to FIG. 3D). The conductive member 18 according to the present embodiment is long in a direction perpendicular to the direction in which each conductive wire material 20 extends, and desirably has a length such that the conductive member 18 can extend over the plurality of conductive wire materials 20.

The conductive member 18 may be, for example, a wire conductive member 18, such as a conductor (electrical conductor) and a conductive thread, or a belt-like conductive member 18, such as conductive tape and a plated member. The plated member is formed by plating a belt-like cloth or a rubber base material, and desirably has a curvable or bendable flexibility. Note that a method of attaching the conductive member 18 to the conductive wire materials 20 is not specifically limited; however, a method, such as bonding, welding and crimping, may be used, for example.

Referring to FIG. 3A to FIG. 3D, the belt-like conductive member 18 is placed on the conductive wire materials 20 at the split portion 22a, and then the conductive wire materials 20 are sewed to the conductive member 18. Then, the conductive member 18 wraps around the conductive wire materials 20 while the fabric material piece 10f is folded downward (one direction) with respect to the fabric material body 10b. Subsequently, the conductive member 18 is sewed onto the front and back surfaces of the fabric material body 10b to thereby electrically connect the conductive wire materials 20 to the conductive member 18. At this time, in the present embodiment, after the above described connecting work, ends 20e of the conductive wire materials 20 may be exposed by separating the fabric material piece 10f from the fabric material body 10b. By checking the ends 20e (the number of wire materials, or the like), it is possible to check whether all the conductive wire materials 20 are electrically connected to the conductive member 18.

Then, the terminal of a power cable (not shown) is connected to the conductive member 18 to form an electrical circuit of the plurality of conductive wire materials 20 in the fabric material 10 (skin material 4S). Lastly, the fabric material 10 having a predetermined shape is sewed onto another fabric material 11 to form the skin material 4S (see FIG. 4). The cushioning material 4P is covered with the skin material 4S, and then the plurality of conductive wire materials 20 are supplied with current. By so doing, the skin material 4S may be used as electrodes of a capacitance sensor or a heater.

As described above, the present embodiment is a relatively simple configuration that the above described fabric material piece 10f is used as a jig for fixing the exposed conductive wire materials 20 (connected portion). With the above configuration, the relative positional relationship among the plurality of conductive wire materials 20 is maintained, so the plurality of conductive wire materials 20 may be electrically connected to the conductive member 18 without crossing the wire materials 20 as much as possible. Therefore, according to the present embodiment, it is possible to electrically connect the conductive member 18 to the conductive wire materials 20 with good connectivity by further simple connecting work. In addition, in the present embodiment, by checking the ends 20e after the connecting work, it is possible to easily check whether all the conductive wire materials 20 are connected to the conductive member 18.

A fabric material according to a first alternative embodiment of the first embodiment has a substantially similar basic configuration to that of the fabric material according to the first embodiment. Therefore, like reference numerals denote the corresponding components, and the detailed description is omitted. In the present embodiment, the fabric material 10 is subjected to the first process and the second process, and then the fabric material 10 is subjected to the following third process. Thus, the durability of the fabric material 10 is improved.

Figure 5:
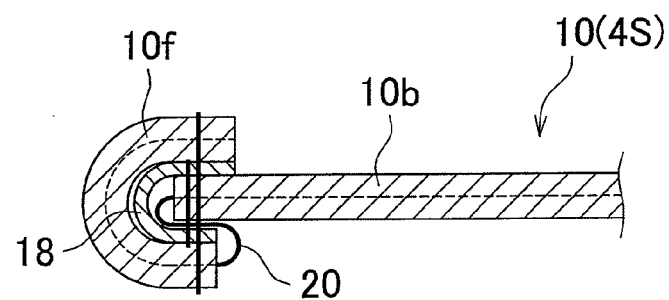
FIG. 5 is a longitudinal cross-sectional view of a skin material according to a first alternative embodiment to the first embodiment.

In the third process, the fabric material piece 10f after connecting work is effectively used as a protective member (see FIG. 5). That is, in this process, the fabric material piece 10f is folded upward with respect to the fabric material body 10b (folded to overlap the conductive member 18 in the other direction opposite to the one direction). By so doing, the fabric material piece 10f wraps around the conductive member 18. Then, the fabric material piece 10f is sewed onto the front and back surfaces of the fabric material body 10b to thereby cover (protect) the conductive member 18 with the fabric material piece 10f. Then, the fabric material 10 having a predetermined shape is sewed onto another fabric material 11 to form the skin material 4S (see FIG. 6). At this time, the ends of the respective fabric materials are sewed together face-to-face to thereby form the bag-shaped skin material 4S. The conductive member 18 is arranged at the end of the fabric material 10 and protrudes from the back surface of the skin material 4S.

Figure 6:
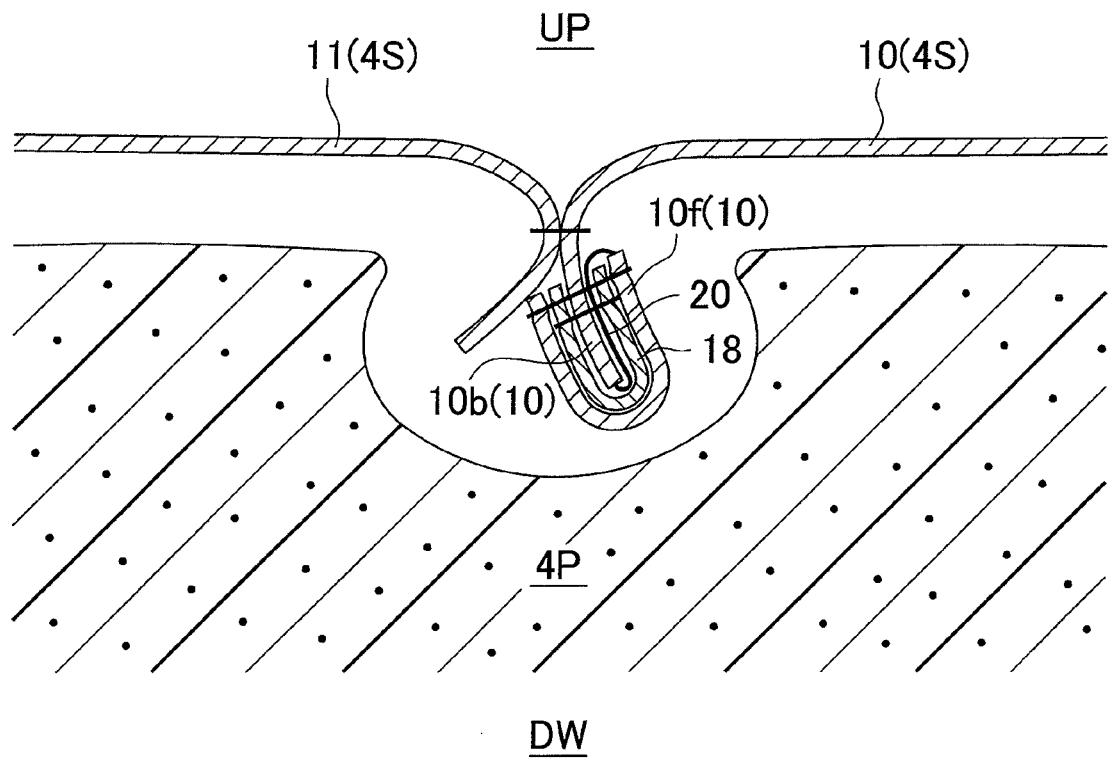
FIG. 6 is a longitudinal cross-sectional view of part of a seat cushion according to the first alternative embodiment to the first embodiment.

Subsequently, referring to FIG. 6, the cushioning material 4P is covered with the fabric material 10, or the skin material 4S. Then, the fabric material end (conductive member 18) will be arranged in a recess of the cushioning material 4P. However, with this configuration, there is a concern that the conductive member 18 contacts (rubs) the cushioning material 4P because of an occupant's seating action, or the like. Then, in the present embodiment, the conductive member 18 is protected by the fabric material piece 10f. By so doing, it is possible to prevent or reduce wear or breakage of the conductive member 18. In addition, even during transport of the skin material 4S (fabric material 10), the conductive member 18 may contact another member. In this case as well, the fabric material piece 10f protects the conductive member 18 to thereby make it possible to prevent or reduce wear or breakage of the conductive member 18. According to the present embodiment, breakage, or the like, of the conductive member 18 during transport or during usage is prevented or reduced to thereby make it possible to improve the durability of the skin material 4S (fabric material 10).

A fabric material according to a second alternative embodiment to the first embodiment has a substantially similar basic configuration to that of the fabric material according to the first embodiment or the first alternative embodiment. Therefore, like reference numerals denote the corresponding components, and the detailed description is omitted. In the first process according to the second alternative embodiment, the splitting device is used to remove the main fiber materials from the fabric material 10 to thereby form a split hole portion 22b (another example of the split portion) between the fabric material body 10b and the fabric material piece 10f (see FIG. 7A). The split hole portion 22b is formed by the fabric material body 10b, the fabric material piece 10f and a pair of coupling portions 22c that couple these fabric material body 10b and fabric material piece 10f. Then, the plurality of conductive wire materials 20 are exposed from the split hole portion 22b. At this time, all the conductive wire materials 20 may be exposed from the split hole portion 22b, or most of the conductive wire materials 20 may be exposed from the split hole portion 22b (that is, at least one of the conductive wire materials 20 may remain unexposed).

Then, in the second alternative embodiment, the fabric material body 10b and the fabric material piece 10f are coupled by the pair of coupling portions 22c. The relative positional relationship between the fabric material body 10b and the fabric material piece 10f is maintained by the coupling portions 22c, so it is possible to prevent or reduce a displacement between the fabric material body 10b and the fabric material piece 10f in the second process. Therefore, in the second process, the conductive member 18 may be sewed onto the conductive wire materials 20 with good workability. In addition, in the third process as well, because the fabric material body 10b is coupled to the fabric material piece 10f, the fabric material body 10b and the fabric material piece 10f may be relatively easily positioned and then sewed to each other.

The fabric material and the manufacturing method according to the present embodiment are not limited to the above described embodiment and alternative embodiments; they may be modified into various forms.

(1) In the present embodiment, the split portion (22a or 22b) is provided at the end of the fabric material 10; however, it is not intended to limit the location of the split portion. That is, a split portion may be provided at the center of the fabric material 10. In addition, when the fabric material 10 is used as electrodes, a single split portion (22a or 22b) may be provided for the fabric material 10. Then, when the fabric material 10 is used as a heater, a plurality of split portions (22a or 22b) may be provided for the fabric material 10. For example, a pair of split portions are provided at both ends of the fabric material 10. Then, a pair of conductive members are attached to both ends of the plurality of conductive wire materials to thereby make it possible to generate heat by conducting current to the conductive wire materials.

(2) In addition, in the first embodiment, the fabric material piece 10f is removed. The fabric material piece 10f may be discarded or may be used as a protective member as in the case of the first alternative embodiment. That is, it is also applicable that the fabric material piece is once removed from the fabric material body and then the fabric material piece is attached to the fabric material body again to protect a conductive member.

Figure 7A:
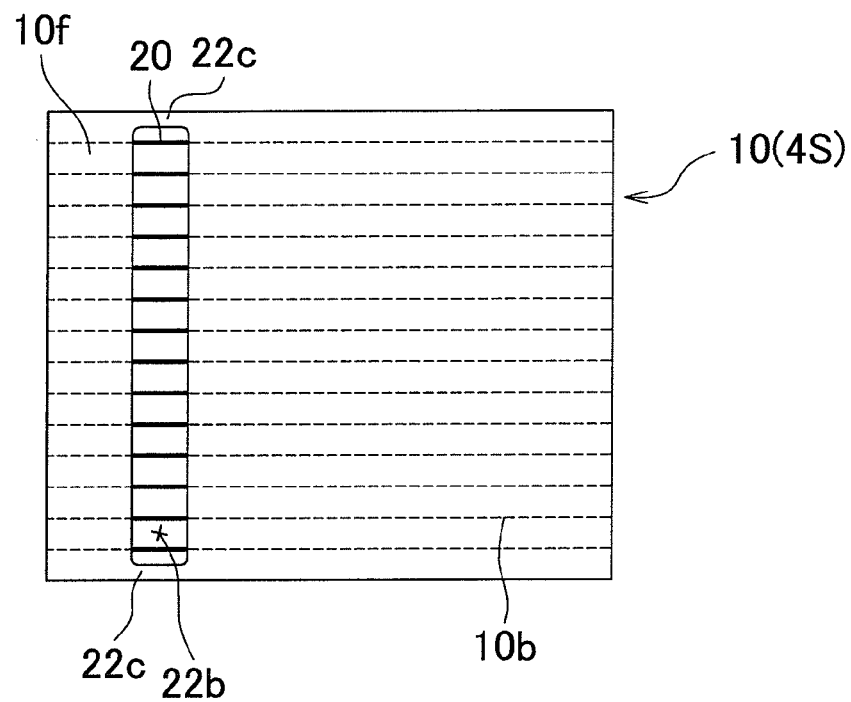
FIG. 7A is a front view of a skin material according to a second alternative embodiment to the first embodiment.
Figure 7B:
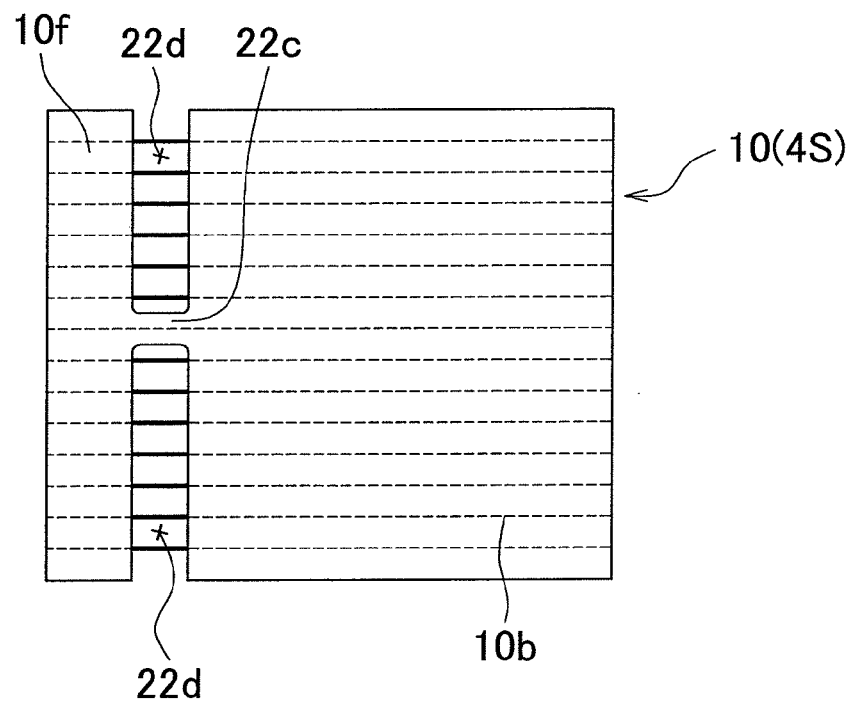
FIG. 7B is a front view of another skin material according to the second alternative embodiment to the first embodiment.
Figure 7C:
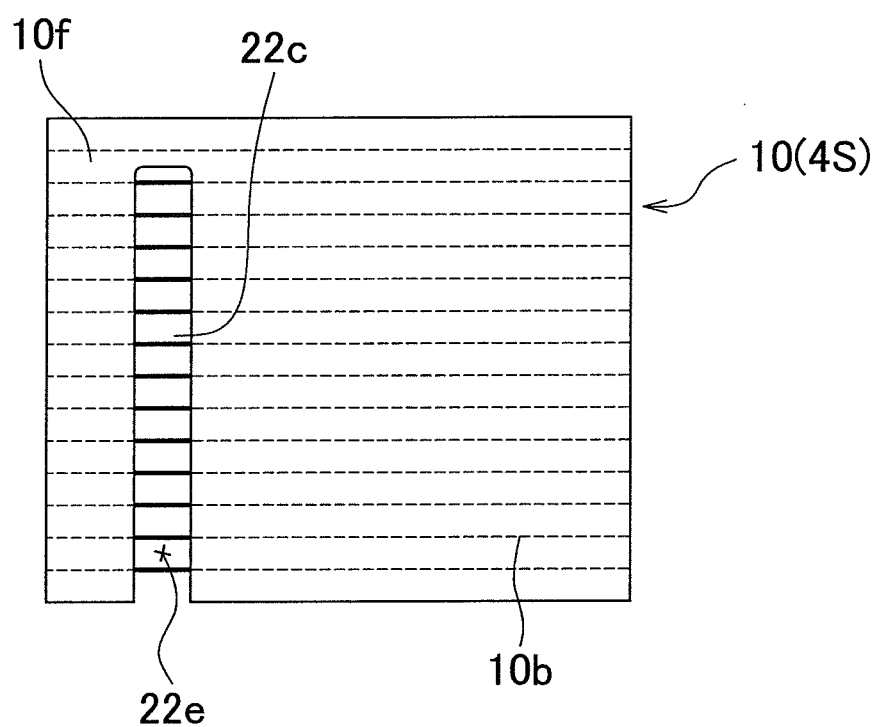
FIG. 7C is a front view of further another skin material according to the second alternative embodiment to the first embodiment.

(3) In addition, in the second alternative embodiment, the pair of coupling portions 22c are formed; however, it is not intended to limit the number of coupling portions, or the like. For example, by appropriately changing the shape of the split portion, a single coupling portion may be formed or a plurality of three or more coupling portions may be formed. For example, it is also applicable that both ends of the fabric material are cut out so as to form a single coupling portion at the center of the fabric material to thereby form a pair of cutouts 22d (another example of the split portion) (FIG. 7B). In addition, it is also applicable that one end of the fabric material is cut out to thereby form a cutout 22e (FIG. 7C).

(4) In addition, a method of attaching the fabric material, the conductive wire materials and the conductive member may be, for example, various methods, such as bonding and fusing, other than sewing.

(5) In addition, in the present embodiment, the fabric material 10 is used for forming the skin material 4S of the seat cushion 4. The fabric material according to the present embodiment may be used for forming skin materials (for example, 4S, 6S and 8S) of various components of the vehicle seat, such as a top plate main portion, a top plate side portion, an outside portion, a seat back portion and the head rest 8. In addition, other than the vehicle seat, the fabric material may be used for forming skin materials of various components of a vehicle, such as a ceiling portion, a door portion and a steering wheel. In addition, in the present embodiment, the fabric material 10 is provided at the seating side of the skin material 4S. Instead, the fabric material 10 may be used as a backing fabric.

A second embodiment attaches the conductive member 18 to the skin material 4S with good storability. The skin material 4S is a bag-shaped member made by coupling a plurality of skin pieces (for example, a first skin piece 40f and a second skin piece 40s), and has a coupling portion CP (described later) (see FIG. 8 and FIG. 15). The first skin piece 40f is a substantially rectangular member (in front view) corresponding to the shape of a seat, and has a basic configuration (the fabric material 10, the pad material 14 and the backing fabric 16). In addition, the second skin piece 40s has a shape that can be coupled to the first skin piece 40f, and has a substantially similar basic configuration to that of the first skin piece 40f. Then, in the present embodiment, the fabric material 10 of the first skin piece 40f has the conductive wire materials 20 (described later) and the conductive member 18 so as to be able to conduct current. Then, in the present embodiment, the configuration of the first skin piece 401 will be described as an example.

Each conductive wire material 20 is able to conduct current, and typically has a resistivity (also referred to as volume resistivity) of $10^0$ to $10^{-12}$ Ω·cm. By attaching the conductive wire materials 20 to the fabric material 10, the fabric material 10 itself may be used as electrodes of a capacitance sensor or a heater. Here, the "resistivity (volume resistivity)" is a physical property value that is used to make a comparison on what material is hard to conduct electricity, and may be measured, for example, in conformity with "JIS K-7194".

The conductive wire material 20 may be, for example, a conductive thread, such as metal and alloy, a filament of a carbon fiber, a covered thread of a carbon fiber, and a plated wire material. The plated wire material has a nonconductive or conductive wire material (core yarn) and a plated layer of metal or alloy. In addition, the carbon fiber is a polyacrylonitrile-based carbon fiber (PAN-based carbon fiber) or a pitch-based carbon fiber. Among others, the filament of a carbon fiber having a firing temperature of 1000° C. or above (a carbonized fiber, a graphitized fiber, a graphite fiber) has a high, electroconductivity, so the filament may be suitably used as the conductive wire material 20 according to the present embodiment.

In addition, the covered yarn of a carbon fiber desirably has core yarn made of carbon fibers (for example, a bundle of a plurality of carbon fiber filaments) and sheath yarn (main fiber material, which will be described later) twisted together with the core yarn. The number of carbon fibers (filaments) in the core yarn is not specifically limited; however, a plurality of two or more carbon fibers (filaments) are typically desirable. Then, by covering the carbon fiber core yarn with the sheath yarn, it is possible to prevent or reduce concentration of stress (shearing force or compressive force in a vertical direction with respect to the axes of fibers) on specific carbon fibers at the time when an occupant is seated. In this way, by improving the durability of the conductive wire materials 20, it is possible to prevent or reduce wire breakage due to pressing or friction at the time when an occupant is seated.

The material of the main fiber material may be, for example, a plant or animal natural fiber, a chemical fiber made of thermoplastic resin or thermosetting resin, or a blended fiber of them. It is only necessary that the main fiber material is a wire member made of the above material, and the main fiber material may be, for example, spun yarn, a filament, drawn yarn or elastic yarn (false twisted yarn or buckle yarn). Note that, in the natural fiber, cotton, hemp or wool is excellent in texture, so cotton, hemp or wool is desirably used as the component of the fabric material 10. In addition, in the chemical fiber, a polyester fiber (for example, a filament of polyethylene terephthalate) and a nylon fiber are excellent in durability, texture and strength, so a polyester fiber or a nylon fiber is desirably used as the component of the fabric material 10. Note that the fineness (D1) of the main fiber material is not specifically limited; however, for example, a main fiber material having about 30 to 3000 dtex may be used (see FIG. 10).

Then, the main fiber material is desirably more inflammable or more meltable than the conductive wire material 20 or a conductor 30 (described later). That is, the main fiber material desirably has a lower melting point than the conductive wire material 20 or the conductor 30 or has a limiting oxygen index (LOI) smaller than 26. Here, the limiting oxygen index (LOI) is the index of concentration of oxygen ($O_2$%) calculated from a minimum oxygen amount required for a wire material, such as an insulating fiber, to keep burning. The limiting oxygen index (LOI) may be measured in conformity with "JIS K7201 Oxygen index flammability test method for polymeric materials" or "JIS L1091 (1999) 8.5 E-2 method (oxygen index test method)".

Figure 8:
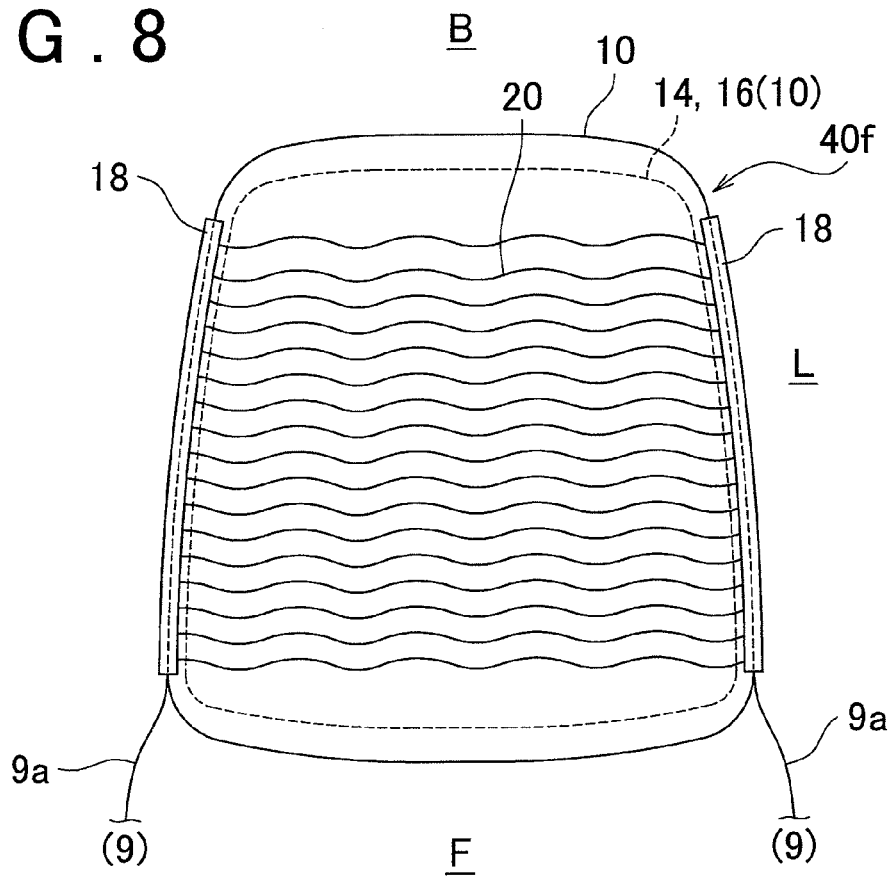
FIG. 8 is a partially see-through front view of a rear surface of a skin material according to a second embodiment.
Figure 15:
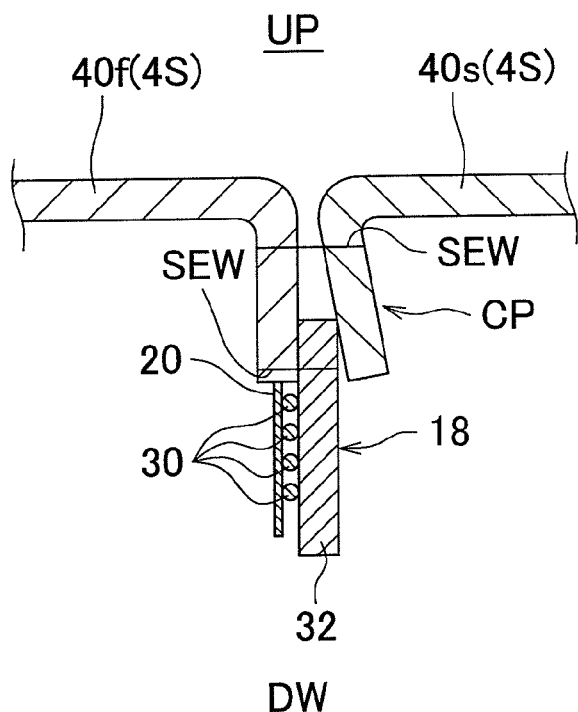
FIG. 15 is a longitudinal cross-sectional view of part of a fabric material.

The fabric material 10 constitutes the seating surface of the skin material 4S (see FIG. 8 and FIG. 15). The fabric material 10 of the first skin piece 401 is a fabric material (a woven fabric, a knit fabric, a nonwoven fabric or a leather) to which the conductive wire materials 20 are attached, and the fabric material 10 of the second skin piece 40s is, for example, a fabric material formed of the main fiber materials. Note that the fabric material 10 may be any woven fabric, such as a plain weave fabric, a twill weave fabric and a satin weave fabric, and may be any knit fabric, such as a warp knit fabric, a circular knit fabric and a weft knit fabric. Then, the fabric material 10 may be any nonwoven fabric that is manufactured of any fiber (material) by any web forming technique and any web joining technique.

The following methods may be used as a method of attaching the conductive wire materials 20.

(1) The conductive wire materials 20 are battened as part of weft yarn of a woven fabric, or the fabric material 10. At this time, exposure of the conductive wire materials 20 to the surface side of the fabric material 10 is suppressed, and more conductive wire materials 20 are arranged and attached at the center (inside) or back side of the fabric material 10.

(2) The conductive wire materials 20 are bonded and attached to the back surface of the fabric material 10.

With the method (1), when the fabric material 10 (woven fabric) is woven, the conductive wire materials 20 (weft yarn) may be battened by interlacing every plurality of pieces of warp yarn 21. At this time, by covering the conductive wire materials 20, the conductive wire materials 20 are resistant to breakage even when they are bent, so the conductive wire materials 20 are able to withstand a bending in a guide or a rapier head. Then, with the method (1), by arranging most of the conductive wire materials 20 at the center (inside) or back surface of the fabric material 10, the conductive wire materials 20 are not exposed on the front surface side (seating surface) of the fabric material 10 as much as possible. By so doing, the durability of each conductive wire material 20 is extremely high against friction or wear.

With the method (2), the conductive wire materials 20 may be bonded and attached to the back surface of the fabric material 10. Then, with the method (2), by arranging all the conductive wire materials 20 on the back surface of the fabric material 10, the conductive wire materials 20 are not exposed to the front surface (design surface) of the fabric material 10.

Note that the single conductive wire material 20 may be arranged on the fabric material 10; however, the plurality of conductive wire materials 20 are desirably arranged parallel to one another (see FIG. 8). For example, when a heater function is imparted to the fabric material 10, the interval between the adjacent conductive wire materials 20 may be set to range from 1 mm to 60 mm. Alternatively, when a sensor (electrode) function is imparted to the fabric material 10, the interval between the adjacent conductive wire materials 20 is desirably set to be 60 mm or below. If the interval between the adjacent conductive wire materials 20 exceeds 60 mm, the sensor function of the fabric material 10 deteriorates (capacitance decreases), so there is a concern that the conductive wire materials 20 do not function as electrodes. Desirably, by setting the upper limit of the interval between the adjacent conductive wire materials 20 at 30 mm, the fabric material 10 has a further suitable sensor function (capacitance).

Each of the first skin piece 40f and the second skin piece 40s desirably has the pad material 14 and the backing fabric 16. Here, the pad material 14 is a flexible porous member, and is desirably more flexible than the cushioning material. The pad material 14 may be, for example, an urethane pad having a high air content or a slab urethane foam made of a flexible urethane foam. In addition, the backing fabric 16 constitutes the back side (side opposite to the seating side) of the skin material 4S, and may be, for example, formed of woven and knit fabrics, a nonwoven fabric or a resin film (for example, polyolefin film (DAF 780) produced by DOW).

In the present embodiment, the above described fabric material 10, pad material 14 and backing fabric 16 are stacked in the stated order and joined together to thereby form the textile stuff (planar shape) of the first skin piece 40f. The joining method is not specifically limited; however, it may be, for example, a method, such as laminating (welding), sewing and bonding. In addition, backing may be provided for (a resin layer may be formed on) the back surface side (backing fabric 16 side) of the first skin piece 40f where appropriate. Then, the textile stuff of the first skin piece 40f is cut into a substantially rectangular shape (seat shape), and then the conductive member 18 (described later) is attached to the fabric material 10 to thereby form the first skin piece 40f. A method of cutting the textile stuff is not specifically limited; however, a removing device (described later) may be, for example, used.

Figure 9:
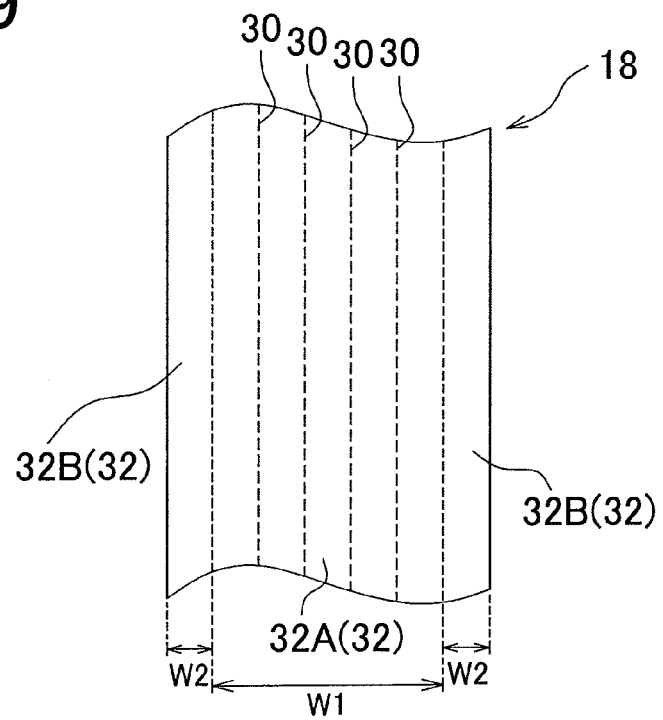
FIG. 9 is a front view of a conductive member.
Figure 10A:
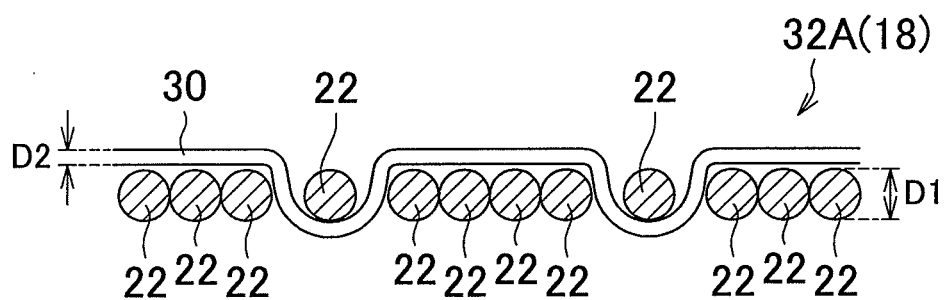
FIG. 10A is a longitudinal cross-sectional view of the conductive member.
Figure 10B:
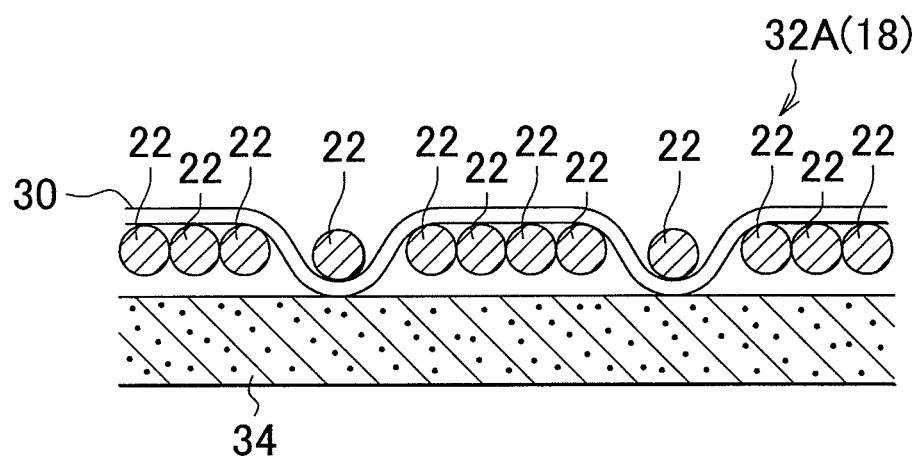
FIG. 10B is a longitudinal cross-sectional view that shows a pressing member and the conductive member.

The conductive member 18 electrically connects the conductive wire materials 20 to a power supply member 9, and includes the plurality of conductors 30, a support member 32 and a pressing member 34 (see FIG. 9 to FIG. 10D). The conductive member 18 according to the present embodiment is a belt-like member having main fiber materials (21 and 22) and the conductors 30 (see FIG. 11A to FIG. 11C). Then, the conductive member 18 is used to supply electric power to the conductive wire materials 20. By so doing, the first skin piece 40f (skin material 4S) may function as electrodes of a sensor or a heater.

Each conductor 30 (second conductive wire material) is a conductive wire material member, and desirably has a lower resistivity than the conductive wire material 20 (see FIG. 10A to FIG. 10D). By setting the electrical resistance of each conductor 30 so as to be lower than that of each conductive wire material 20, it is possible to prevent or reduce the conductive member 18 from generating heat when conducting current. Here, the resistivity of each conductor 30 may be appropriately set using the resistivity of each conductive wire material 20. Typically, by setting the resistivity of each conductor 30 so as to range from 1.4 to $15 \times 10^{-8}$ Ω·m, it is possible to prevent or reduce the conductive member 18 from generating heat when conducting current.

The material of the conductor 30 may be, for example, gold, silver, copper, brass, platinum, iron, steel, zinc, tin, nickel, aluminum or tungsten. Among others, a copper conductor 30 (copper wire material) is easily made and less expensive, so it may be suitably used as the conductor 30 according to the present embodiment. In addition, each conductor 30 may be plated with a plated layer made of the above material. By forming the plated layer on each conductor 30, the contact resistance between the conductors 30 and the conductive wire materials 20 may be reduced, and the corrosion resistance of each conductor 30 may be improved. Note that the material of the plated layer is not specifically limited; however, a plated layer made of tin or silver, which is less expensive, may be suitably used. In addition, a wire material formed by forming a plated layer on the surface of a main fiber material may also be used as the conductor 30 according to the present embodiment.

Here, the thickness (D2) of each conductor 30 is not specifically limited; however, for example, a conductor 30 having a diameter of 0.01 mm to 2.0 mm may be used (see FIG. 10A to FIG. 10D). In addition, the conductor 30 may be single yarn or twisted yarn for which a binding device or method is used to twist 2 to 1000 conductors 30 each having a diameter of 0.05 mm. Note that the binding device or method is not specifically limited. When real twisting is employed as the binding method, the number of twist of twisted yarn is desirably 30 to 200 per meter. Here, when the number of twist is smaller than 30 per meter, the conductors 30 may be loosened during sewing (the adjacent conductors 30 rub each other to cause the twisted yarn into pieces). Then, by setting the number of twist of the twisted yarn at 50 to 150 per meter (pitch: 7 to 10 mm), it is possible to further reliably prevent or reduce loosening of the conductors 30 during sewing. In addition, a binder (another example of the binding device or method), such as oil and resin, may be used to bind the conductors 30. In this case, the binder may be removed after weaving the support member 32 (described later).

The support member 32 is a belt-like woven fabric formed of warp yarn 21 (first yarn), weft yarn 22 (second yarn) and the conductors 30. The support member 32 has a conductive portion 32A and an attached portion 32B (see FIG. 9 to FIG. 11C). Then, the support member 32 according to the present embodiment is a belt-like member that is long in a direction in which the warp yarn 21 (first yarn) is routed. Then, in the present embodiment, the plurality of conductors 30 are attached to the conductive portion 32A (described later) in parallel with one another so as to be routed linearly in the warp yarn direction (first yarn direction). In this way, in the conductive portion 32A, the plurality of conductors 30 are arranged linearly in parallel with one another, so the width (W1) of the conductive portion 32A may be reduced.

The conductive portion 32A according to the present embodiment is a belt-like member that is long in the warp yarn direction (first yarn direction) of the support member 32, part or whole of warp yarn of the conductive portion 32A is formed of the conductors 30. For example, all the warp yarn of the conductive portion 32A may be formed of the conductors 30 (see FIG. 11A). Here, the structure configuration of the conductive portion 32A is not specifically limited; however, the structure desirably has many warp yarn floats so that many conductive wire materials 20 are exposed at one face side (side facing the coupling portion CP) of the conductive member 18. For example, referring to FIG. 11A, the conductive portion 32A may be formed of a structure such that warp yarn crosses over three pieces of weft yarn and then passes under one piece of weft yarn in the warp yarn direction.

In addition, part of the warp yarn of the conductive portion 32A may be formed of the conductors 30. That is, the warp yarn of the conductive portion 32A is formed of the warp yarn 21 (main fiber materials) and the conductors 30 (see FIG. 11B). At this time, the structure configuration formed of the warp yarn 21 and the weft yarn 22 may be the same as the structure configuration formed of the conductors 30 and the weft yarn 22 or may be different from the structure configuration formed of the conductors 30 and the weft yarn 22. For example, the structure configuration formed of the conductors 30 and the weft yarn 22 is formed as a satin weave structure shown in FIG. 11A, and the structure configuration formed of the warp yarn 21 and the weft yarn 22 is formed as a plain weave structure (see FIG. 11C). By tightening the conductive portion 32A with a plain weave structure, a difference in thick feel from the attached portion 32B (described later) may be reduced (the support member 32 may be flattened). Then, the flat support member 32 has an excellent handleability, so the flat support member 32 may be smoothly sewed to the coupling portion CP.

The attached portion 32B is a belt-like portion that is arranged at each side or one side of the conductive portion 32A, and is formed of the main fiber materials. The width (W2) of the attached portion 32B is not specifically limited; however, the attached portion 32B desirably has a width such that the attached portion 32B is desirably stably attachable to the coupling portion CP (see FIG. 9, FIG. 13 and FIG. 15). In addition, the attached portion 32B is desirably tougher than the conductive portion 32A (for example, the attached portion 32B has a tough structure configuration such that many crossover points are present in a complete weave, or is formed of PET yarn, or the like, having a higher elongation than the conductor 30). By making the attached portion 32B be tough, the conductive member 18 may be stably attached to the coupling portion CP. Then, referring to FIG. 11B, the attached portion 32B may be formed of a twill weave structure (2/2 ↗ twill weave structure, 3/17↗ twill weave structure, or the like). The attached portion 32B having this type of twill weave structure has a thick feel and excellent sewability, so the attached portion 32B may be stably sewed onto the coupling portion CP.

The pressing member 34 according to the present embodiment is an elastic belt-like member. The material of the pressing member 34 is not specifically limited; however, the material of the pressing member 34 may be, for example, foamable resin such as urethane foam, elastomer, rubber, bulky nonwoven fabric, and bulky woven and knit fabrics (see FIG. 10B). Then, in the present embodiment, the pressing member 34 is attached to the other surface side of the conductive portion 32A. Then, the pressing member 34 elastically supports the conductive member 18 to thereby press the conductors 30 against the conductive wire materials 20. In this way, by pressing the conductors 30 against the conductive wire materials 20, it is possible to improve connection stability between the conductive wire materials 20 and the conductive member 18.

In addition, bulky weft yarn 22 may be used for the conductive portion 32A as a pressing member 35 of another example (see FIG. 10C). For example, a wire material that is thicker (larger in fineness) than the conductive member 18 or the conductor 30 may be used as the weft yarn 22 of the conductive portion 32A. Then, by elastically supporting the conductive member 18 with the pressing member 35 (bulky weft yarn 22), it is possible to press the conductors 30 against the conductive wire materials 20. Note that the fineness (D3) of the weft yarn 22, or the pressing member, is not specifically limited; however, for example, the fineness (D3) is desirably 1500 to 3000 dtex.

Furthermore, a structure (two-story structure) may be used as another pressing member 35a (see FIG. 10D). In the two-story structure, the weft yarn 22 of the conductive portion 32A is arranged on both upper and lower sides of the warp yarn 21 (main fiber materials). Then, the conductors 30 are crossed up and down between the upper-side weft yarn 22 and the lower-side weft yarn 22 to thereby make it possible to elastically support the conductors 30 with a bulky two-story structure. Then, with the above configuration, yarn having a greater tensile force than the conductor 30 (desirably, yarn having a tensile force that is twice as great as that of the conductor 30) is desirably used as the warp yarn 21 (main fiber material). Furthermore, it is desirable that the structure formed of the warp yarn 21 (main fiber materials) and the weft yarn 22 is set to a plain weave structure to arrange the weft yarn 22 on both upper and lower sides of the warp yarn 21 (main fiber materials) (see FIG. 11C). Then, the pressing member 35a elastically supports the conductive member 18 to thereby make it possible to suitably press the conductors 30 against the conductive wire materials 20.

A manufacturing method for the conductive member 18 desirably includes the following first to third processes. The conductive member 18 is manufactured through these three processes. By so doing, it is possible to relatively easily carry out electrical connection between the conductive member 18 and the power supply member 9 (see FIG. 14A to FIG. 14C). First Process: When the warp yarn 21 and the weft yarn 22 are used to make the support member 32, the conductors 30 are arranged in the warp yarn direction. At this time, the number of arrangement (battening amount) of the weft yarn 22 at an end of the support member 32 may be reduced, or an end of the support member 32 may formed of only the warp yarn 21. Second Process: The removing device, such as a laser, is used to remove the end of the support member 32 and then expose the conductors 30. Third Process: The conductors 30 exposed from the end are bound to form a connecting portion 36 that is connectable with the power supply member 9.

In the first process, a loom is used to make the support member 32 while arranging the plurality of conductors 30 in the warp yarn direction of the conductive portion 32A. At this time, in order to easily connect the connecting portion 36 (described later) to the power supply member 9, the number of arrangement of the weft yarn 22 at an end of the conductive member 18 may be reduced. For example, when the normal number of arrangement of the weft yarn 22 is set at 20 per 2.54 cm, the number of arrangement of the weft yarn 22 at the end may be set at 1 per 2.54 cm. In addition, in order to further easily connect the connecting portion 36 to the power supply member 9, the end of the conductive member 18 may be made of only the warp yarn 21 (see FIG. 14A to FIG. 14C). Note that a device or method for adjusting the number of arrangement of the weft yarn 22 is not specifically limited. For example, the speed of a belt feed roller of a loom is electronically controlled to make it possible to adjust the number of arrangement of the weft yarn 22 (weft yarn density) to a desired value.

Note that the above described main fiber material may be used as the warp yarn 21 and the weft yarn 22. Here, in consideration of ease of weaving preparation, ease of weaving, polyester filament yarn is desirably used as the warp yarn 21. In addition, in consideration of ease of production and productivity, polyester filament yarn is desirably used as the weft yarn 22.

The type of loom is not specifically limited; however, the loom may be, for example, a shuttle loom, a rapier loom, an air-jet loom, a water-jet loom or a needle loom. Among others, the needle loom is suitable for mixedly weaving the main fiber materials (21 and 22) and the conductors 30, so the needle loom is able to weave the conductive member 18 with good productivity. Particularly, a narrow needle loom is able to make a belt-like (ribbon-like or tape-like) conductive member 18 with good productivity.

Figure 14A:
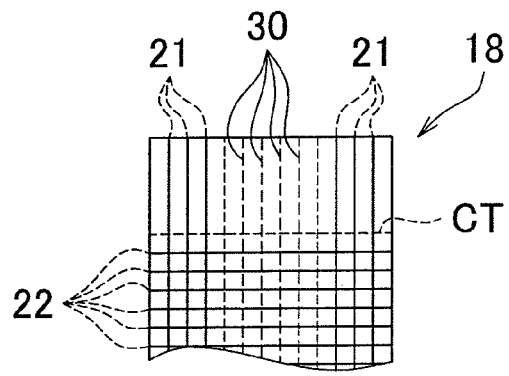
FIG. 14A is a front view of a conductive member.
Figure 14B:
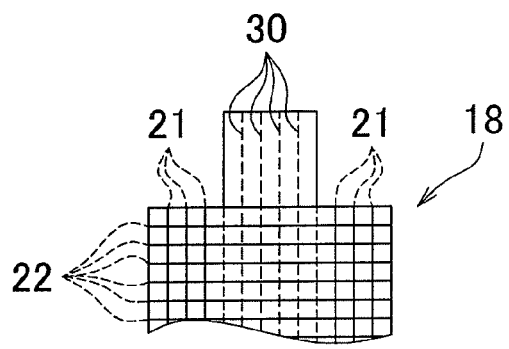
FIG. 14B is a front view that shows a state where part of the conductive member is cut.
Figure 14C:
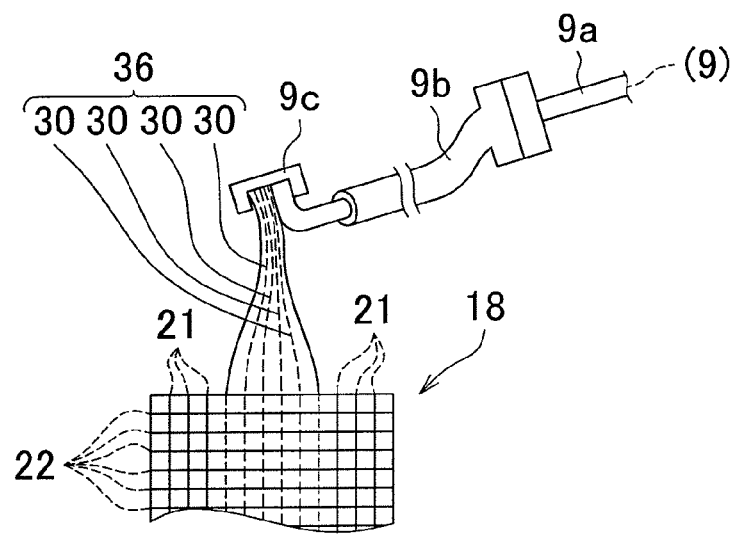
FIG. 14C is a front view that shows the conductive member having a connecting portion and part of electrodes.

In the second process, the removing device (described later) is used to remove the main fiber materials located at the end of the support member 32 to thereby expose the conductors 30 (see FIG. 14A to FIG. 14C). For example, laser light is irradiated to the conductive member 18 to cut the warp yarn 21 at the end of the support member 32 to thereby form a cut line CT. At this time, the conductors 30 that are less meltable than the warp yarn 21 are not cut by the removing device but remain unchanged. Then, by, for example, separating the end from the cut line CT, it is possible to expose the conductors 30 by removing the warp yarn 21 at the end of the support member 32. In addition, by fusing the resin warp yarn 21 (polyester filament yarn, or the like), a yarn end (cut surface) of the warp yarn 21 becomes solidified. Thus, it is possible to prevent or reduce fraying of the warp yarn 21.

The removing device may be, for example, a remover (a punch mechanism, a scissors mechanism) that is physically contactable with the support member 32 or an optical removing device, such as a laser. Among others, the laser is able to accurately control temperature (output), so the laser is suitably used as the removing device according to the present embodiment. The type of laser is not specifically limited; however, the layer may be, for example, a $CO_2$ laser, a YAG laser, an excimer laser, a UV laser, a semiconductor laser, a fiber laser, an LD laser or an LD-pumped solid laser. Among others, the $CO_2$ laser is desirable because its laser light is relatively easily absorbed by organic matter (main fiber materials).

Then, by appropriately regulating the set output of the laser, it is possible to burn or melt and cut only the main fiber materials (warp yarn 21) while leaving the conductors 30. For example, a Mitsubishi $CO_2$ laser processing machine (type: 2512H2, oscillator type: 25SRP, laser rated output: 1000 W) is used as the removing device. At this time, the irradiation conditions of the laser processing machine are set so that the output is higher than or equal to 15 W and lower than 25 W (frequency 200 Hz, processing speed 1500 min/min). By so doing, the main fiber materials may be burned (melted) while the conductors 30 are left as much as possible.

In the third process, the conductors 30 exposed at the end of the conductive member 18 are bound to from the connecting portion 36 that is connectable with the power supply member 9 (ECU). At this time, redundant warp yarn 21 (insulating warp yarn 21) is removed in advance, so the connecting portion 36 may be formed of only the conductors 30. Note that a method of binding the conductors 30 is not specifically limited; however, the plurality of conductors 30 may be, for example, twisted together to be integrated (using real twisting).

In the present embodiment, the main fiber materials at both ends of the first skin piece 40f are removed to expose the conductive wire materials 20 (see FIG. 8). For example, the removing device is used to melt (burn) only the main fiber materials at the ends of the first skin piece 40f to thereby make it possible to form cut lines at both ends of the first skin piece 40f. Then, the side portions are separated from the first skin piece 40f to expose the conductive wire materials 20.

Subsequently, referring to FIG. 12 to FIG. 14C, a pair of the conductive members 18 are respectively arranged at both ends of the first skin piece 40f, and then the respective attached portions 32B are sewed onto the first skin piece 40f (sewing line SEW). By so doing, the relative positional relationship between each conductive member 18 and the corresponding conductive wire materials 20 is suitably maintained, so electrical connection stability between each conductive member 18 and the corresponding conductive wire materials 20 is improved. Then, each conductive portion 32A is sewed to the corresponding conductive wire materials 20 to electrically connect each conductive member 18 to the corresponding conductive wire materials 20 (sewing lines SEW). At this time, by providing the pressing member 34 or 35 for each conductive member 18, it is possible to improve connection stability between the conductive wire materials 20 and the conductors 30.

Figure 16:
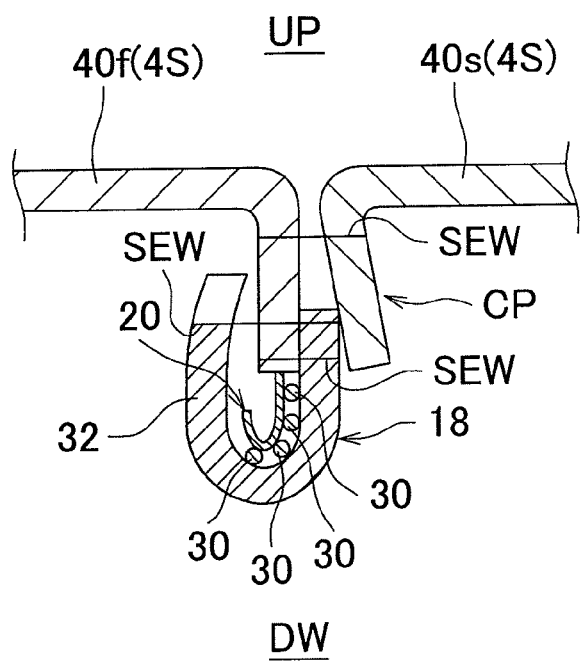
FIG. 16 is a longitudinal cross-sectional view of part of another fabric material.

In addition, in the present embodiment, referring to FIG. 16, the conductive member 18 is folded in a substantially U shape to the end of the first skin piece 40f to thereby make it possible to fixedly sew the conductive member 18 to the end of the first skin piece 40f (sewing line SEW) in a state where each conductive member 18 wraps around the corresponding conductive wire materials 20. In this way, each conductive member 18 is used as a protective member for the conductive wire materials 20. This inhibits contact between the conductive wire materials 20 and other members (cushioning material, and the like) as much as possible. Thus, it is possible to prevent or reduce breakage or wear of the conductive wire materials 20. Note that, in the present embodiment, each conductive member 18 is attached to the front surface side (the fabric material 10) of the first skin piece 40f (see FIG. 15 and FIG. 16). Instead, each conductive member 18 may be attached to the back surface side (the backing fabric 16) of the first skin piece 40f.

Then, the end of the first skin piece 40f and the end of the second skin piece 40s are sewed together face-to-face to thereby form the coupling portion CP (see the sewing line in FIG. 15 and FIG. 16). The coupling portion CP is arranged so as to protrude from the back surface (the other surface) side of the skin material 4S. At this time, each conductive member 18 is sewed to the end of the first skin piece 40f (coupling portion CP), and is electrically connected to the conductive wire materials 20 exposed from the coupling portion CP. Subsequently, the connecting portion 36 of each conductive member 18 is connected to a cable terminal 9a of the power supply member 9 by a crimping member 9c and a connector 9b. In this way, each conductive member 18 is electrically connected to the power supply member 9 (ECU) to thereby make it possible to form the circuit of the plurality of conductive wire materials 20 in the first skin piece 40f. In the present embodiment, the pair of conductive members 18 are used to form a parallel circuit of the plurality of conductive wire materials 20. Thus, it is possible to conduct current to the plurality of conductive wire materials 20 (generate heat) at a relatively low voltage. Then, in the present embodiment, the pair of conductive members 18 may be respectively arranged at the two opposite ends of the first skin piece 40f (see FIG. 8). By so doing, the conductive members 18 are able to conduct current to the conductive wire materials 20 located between both ends (relatively wide range).

As described above, in the present embodiment, each conductive member 18 is arranged at the coupling portion CP that is arranged to protrude from the other surface. By so doing, it is possible to suitably maintain seatability of one surface (for example, seating surface) of the skin material 4S. In addition, by arranging each conductive member 18 at the coupling portion CP, each conductive member 18 is less susceptible to a shock caused by a seating action (resistant to a mechanical load). Thus, wire breakage of the conductor 30 is prevented or reduced. Then, in the present embodiment, the plurality of conductors 30 are attached to the support member 32 in parallel with one another so as to be routed linearly in the warp yarn direction. That is, each conductive member 18 is made compact. Therefore, according to the present embodiment, it is possible to attach each conductive member 18 to the skin material 4S with good storability without adversely influencing the characteristics of the skin material 4S as much as possible.

Hereinafter, the second embodiment will be described on the basis of examples; however, the aspect of the invention is not limited to the examples. In a first example of the second embodiment, colored (ivory) polyethylene terephthalate (PET) false twisted yarn (167 dtex/2-48 filaments) was used as the warp yarn of a first skin piece. Core yarn of carbon fibers ("Torayca (trademark) T300-1K-50A" produced by Toray Industries, Inc.) and wrap yarn (22 dtex-7 filaments) of nylon 6 were used as first weft yarn (conductive wire materials). Then, S twist double covering was applied to the core yarn using the wrap yarn at the number of twist 400 T/m, and then the resultant yarn was used as the first weft yarn (conductive wire materials). Colored (ivory) PET false twisted yarn (84 dtex/2-36 filaments) was used as second weft yarn. Then, after the warp yarn was warped, while the first weft yarn and the second weft yarn were alternately battened (a pattern was represented) by a Jacquard loom, the first weft yarn (conductive wire materials) was battened at a frequency of one per 38 pieces of second weft yarn. At this time, the first weft yarn was battened every 8 pieces of warp yarn to thereby arrange the first weft yarn on the surface of the fabric material at a rate of 1 piece of first weft yarn with respect to 8 pieces of warp yarn. At this time, in consideration of the pattern of the fabric material, the front-side first weft yarn (conductive wire materials) was arranged between the floating patterns of the warp yarn (recess portions) to thereby make the surface material of the first skin piece.

Subsequently, known finishing (raising, shearing) was applied to the surface material of the first skin piece, and then a backing agent was applied to the back surface of the first skin piece and then dried. The main components of the backing agent were a flame retardant and an acrylic polymer that is synthesized from butyl acrylate and acrylonitrile. Then, the backing agent was applied at 45 g/m$^2$ at a drying temperature of 150° C. for 1 minute. The finished density of the surface material was warp/weft=141/2.54 cm/98/2.54 cm. The interval (W1) between the adjacent conductive wire materials was 10 mm. Then, the pad material (thickness 5 mm) of urethane sheet and the backing fabric of half tricot (nylon 6 of 15 dtex) were arranged on the back surface of the fabric material, and then the fabric material, the pad material and the backing fabric were integrated by flame-laminating to thereby make the textile stuff of the first skin piece.

In the first example, each belt-like conductive member was made through the following procedure. A narrow needle loom NG-3 (produced by Jacob Mueller) was used as a loom. PET drawn yarn (560 dtex-96 filaments) was used as weft yarn. PET false twisted yarn (333 dtex-72 filaments) was used as first warp yarn. A wire material (φ0.05 mm, 22 filaments, twisted 50 times per meter) for which copper wire materials with tin plated layer are twisted together was used as second warp yarn (conductor).

At the time of warping, 24 pieces of second warp yarn (conductors) were arranged at the center, and 20 pieces of first warp yarn were arranged at each end. The number of weft yarn battened was set at 21 per 2.54 cm; however, the actually measured value after weaving was 20 per 2.54 cm. Then, in the first example, the conductive portion was made with the structure shown in FIG. 11A, and the pair of attached portions were made with the structure shown in FIG. 11B. The width of each conductive portion was 15 mm, and the thickness was 0.52 mm (measuring method for thickness "JIS L10968.5.1"). In addition, the width of each of the pair of attached portions was 5 mm.

In the first example, each conductive member has a three-layer structure in which the support member, the pressing member and the backing fabric are laminated in the stated order. A urethane foam (flexible urethane foam ERG-S 2 mm produced by INOAC Corporation) was used as the pressing member. In addition, a half tricot (knit using nylon 6 of 17 dtex and 3 filaments) was used as the backing fabric. Then, the pressing member and the backing fabric were laminated on the other surface of the conductive portion in the stated order.

In the first example, the connecting portion that is connectable with the power supply member was formed in each conductive member. More specifically, a laser processing machine (described later) was used to irradiate laser light to a surface opposite to the one surface of each conductive member to thereby cut the first warp yarn (PET yarn) and the weft yarn. The irradiation conditions of the laser at this time were set at a speed of 1500 mm/min, an output of 20 W, a duty of 7.7% and a frequency of 200 Hz. Then, the first warp yarn (PET yarn) and weft yarn of each conductive member were melted and cut by the removing device; however, the second warp yarn (conductors) were not cut but remained unchanged. In addition, there was no fraying of component yarn on the cut surface (melted surface) of each conductive member. Then, by binding the second warp yarn (conductors) exposed from each conductive member, the connecting portion that is connectable with the power supply member (ECU) was formed.

A Mitsubishi $CO_2$ laser processing machine (type: 2512H2, oscillator type: 25SRP, laser rated output: 1000 W) was used as the removing device. Then, laser light was irradiated to the textile stuff of the first example to cut the first skin piece having a predetermined size from the textile stuff for main seat face (see FIG. 8). The irradiation conditions of the laser at this time were set at a speed of 500 mm/min, an output of 30 W, a duty of 7.7% and a frequency of 200 Hz. Subsequently, laser light was irradiated to the first skin piece (back surface side) to thereby form a pair of cut lines at both sides. The irradiation conditions of the laser were set at a speed of 1500 mm/min, an output of 20 W, a duty of 7.7% and a frequency of 200 Hz. At this time, the PET yarn (main fiber materials) was melted and cut by the removing device; however, carbon fibers (conductive wire materials) were not cut but remained unchanged. Subsequently, the ends were separated from the first skin piece to expose the side portions of the conductive wire materials. Then, the attached portions of the conductive members were sewed onto the surface of the first skin piece, and then the conductive wire materials and the conductive portion were sewed to each other to thereby connect the conductive wire materials to the conductive portion so as to closely contact each other (the conductive members were attached to the coupling portion).

In a second example of the second embodiment, each belt-like conductive member (woven fabric) was made through the following procedure. The narrow needle loom NG-3 was used as a loom. PET drawn yarn (560 dtex-96 filaments) was used as weft yarn. PET drawn yarn (560 dtex-96 filaments) was used as first warp yarn. A wire material (φ0.05 mm, 22 filaments, twisted 50 times per meter) for which copper wire materials with tin plated layer are twisted together was used as second warp yarn (conductors). PET drawn yarn (1670 dtex-144 filaments) was used as third warp yarn (pressing member (35a)).

Figure 11A:
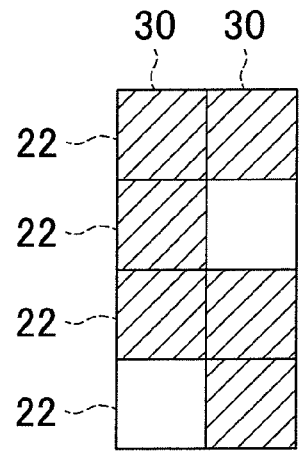
FIG. 11A is an example of the structure configuration of a conductive portion of the conductive member.
Figure 11B:
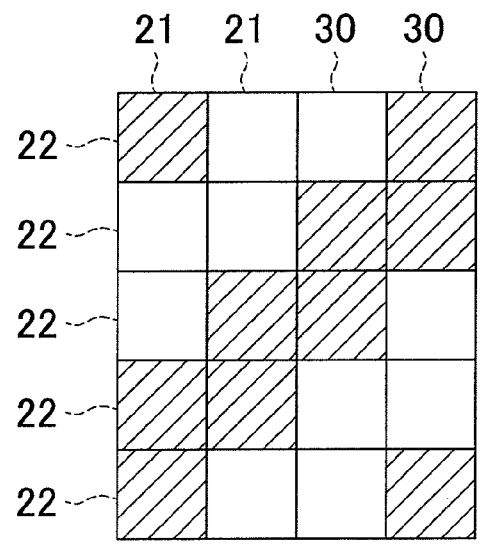
FIG. 11B is an example of the structure configuration of an attached portion of the conductive member.
Figure 11C:
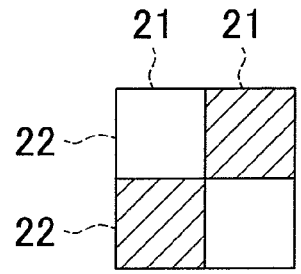
FIG. 11C is another example of the structure configuration of the conductive portion of the conductive member.
Figure 12:
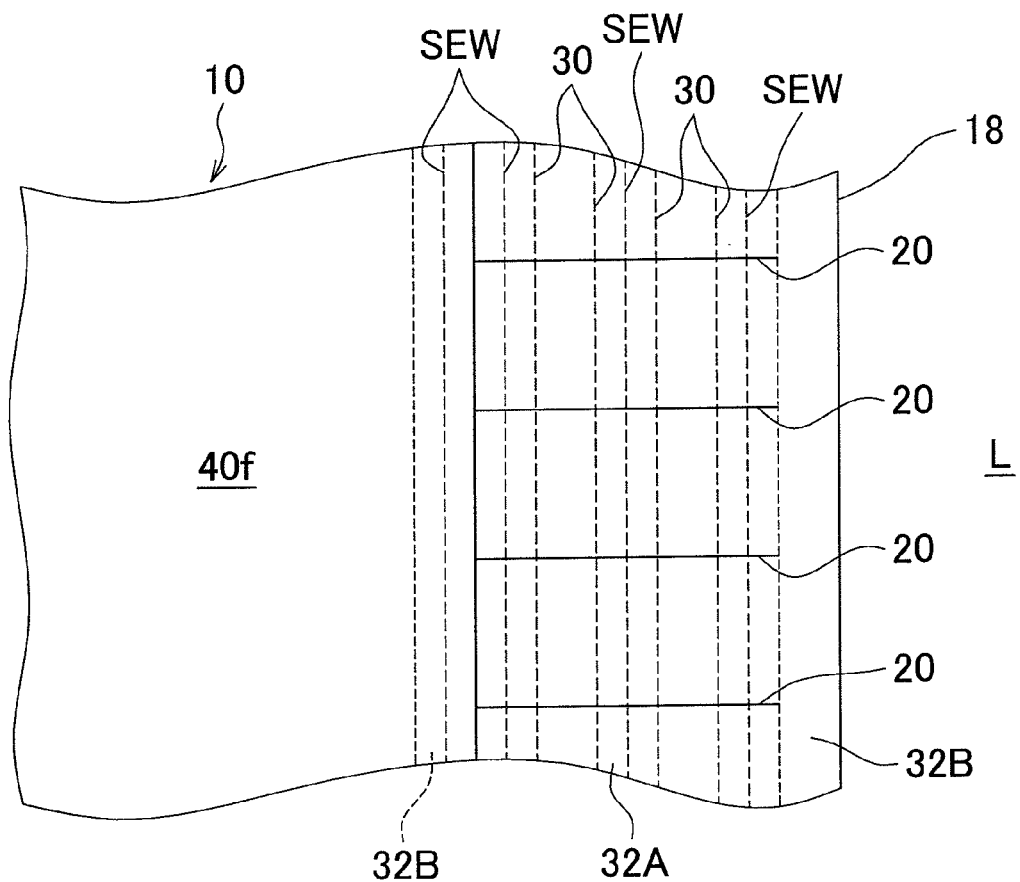
FIG. 12 is a front view of a side portion of a first skin piece (rear surface)
Figure 13:
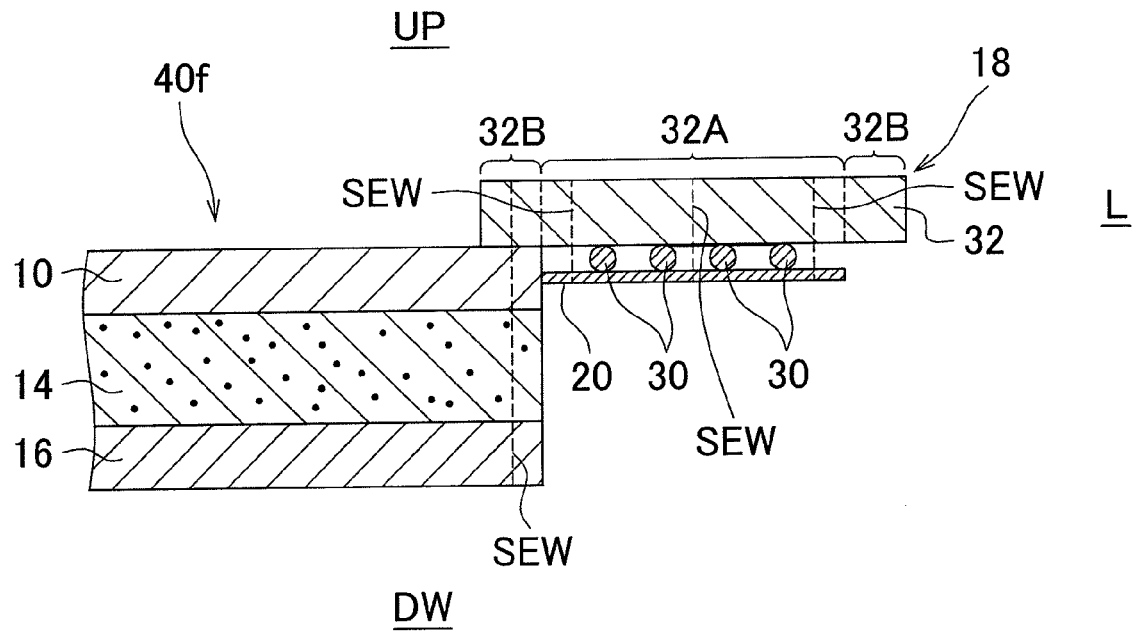
FIG. 13 is a longitudinal cross-sectional view of the side portion of the first skin piece.

In the second example, 24 pieces of second warp yarn (conductors) and 22 pieces of third warp yarn (PET yarn) were used to make each conductive portion. That is, at the time of warping, two pieces of second warp yarn (conductors) and two pieces of third warp yarn (PET yarn) were alternately arranged at the center. In addition, 20 pieces of first warp yarn were arranged at each end. The number of weft yarn battened was set at 30 per 2.54 cm; however, the actually measured value after weaving was 31 per 2.54 cm. Then, the pair of attached portions were made with the structure shown in FIG. 11B. In addition, in each conductive portion, the structure configuration formed of the second warp yarn (conductors) and the weft yarn was varied from the structure configuration formed of the third warp yarn (PET yarn) and the weft yarn. That is, the structure configuration formed of the second warp yarn (conductors) and the weft yarn was set as shown in FIG. 11A, and the structure configuration formed of the third warp yarn (PET yarn as the pressing member (35a)) and the weft yarn was set as shown in FIG. 11C. At this time, the tensile force (150 g per each piece of yarn) of each piece of the third warp yarn (PET yarn) was higher than the tensile force (50 g per each piece of yarn) of each piece of the second warp yarn (conductor), so the weft yarn (22) was able to be arranged on both sides of the third warp yarn (21) (two-story structure) as shown in FIG. 10D. The width of each conductive portion was 17 mm, and the thickness was 0.95 mm. In addition, the width of each of the pair of attached portions was 3 mm. Then, the first warp yarn and third warp yarn (PET yarn) and the weft yarn of each conductive member were removed by the same method as that of the first example to thereby leave the second warp yarn (conductors). At this time, there was no fraying of component yarn on the cut surface (melted surface) of each conductive member. Then, by binding the second warp yarn (conductors) exposed from each conductive member, the connecting portion that is connectable with the power supply member (ECU) was formed.

Each conductive member according to the first example had a thick feel at the attached portions and had an excellent sewability to the first skin piece. In addition, each conductive member according to the second example had flat support members, so the handleability was excellent. In addition, in any conductive member, the plurality of conductors were arranged linearly in parallel with one another, so the width of each conductive portion was small and, as a result, each conductive member had a compact configuration. In addition, in the first example, the pressing member (laminate of urethane foam) was used to thicken each conductive portion. Thus, connection stability between the conductive wire materials and the conductors was able to be improved. In addition, in the second example as well, the pressing member having the two-story structure was used to thicken each conductive portion. Thus, connection stability between the conductive wire materials and the conductors was able to be improved. Then, each of the conductive members according to the first example and the second example was able to be attached to the end of the first skin piece (coupling portion) with good storability. Therefore, according to the first example and the second example, it is found that each conductive member may be attached to the skin material with good performance without adversely influencing the characteristics of the skin material.

The skin material of the vehicle interior equipment according to the second embodiment is not limited to the above described embodiments; it may be modified into various forms.

(1) In the second embodiment, the first skin piece 40f is used for a seating portion. The first skin piece 40f according to the present embodiment may be used as skin pieces of various components of the vehicle seat 2, such as a seating surface main portion of a seat back, a seating surface side portion of the seat back, an outside portion of the seat back, a back portion of the seat back and the head rest 8. In addition, other than the vehicle seat 2, the first skin piece 40f may be used as skin pieces of vehicle interior equipment of a vehicle, such as a ceiling portion, a door portion, a steering wheel and a console box.

(2) In the second embodiment, the conductive wire materials 20 are arranged in the first skin piece 40f in a wavy shape. The conductive wire materials 20 may be arranged in a surface material in various forms, such as in a linear shape and in a zigzag shape.

(3) In the second embodiment, the plurality of conductive wire materials 20 are arranged in the seat width direction in parallel with one another in the first skin piece 40f. The arrangement of the plurality of conductive wire materials 20 is not specifically limited; for example, the plurality of conductive wire materials 20 may be arranged in the seat front-rear direction in parallel with one another. In this case, the pair of conductive members 18 are arranged at the front and rear of the seat.

(4) In the second embodiment, the conductors 30 are arranged linearly in the conductive portion 32A. The conductors may be arranged in the conductive portion in various forms, such as in a wavy shape and in a zigzag shape, as long as the width of each conductive member is not excessively large.

(5) In the second embodiment, the conductors 30 are arranged in the warp yarn direction. The conductors 30 may be arranged in the weft yarn direction where possible.

(6) In the second embodiment, the belt-like conductive members 18 are described as an example. Each conductive member may be a linear member, and each conductive member may be, for example, formed of conductors only.

(7) In the second embodiment, the skin material 4S functions as a heater as an example. The skin material 4S may be used as electrodes of a capacitance sensor. In this case, a single conductive member 18 may be attached to only an end (one side) of the first skin piece 40f.

(8) In the second embodiment, sewing is described as the method of coupling skin pieces and the method of attaching the skin piece to the conductive member. Other than sewing, the method of coupling these components and the method of attaching these components may be various methods, such as bonding, melting and hog ring fastening using a ring member.

In a third embodiment, each skin material (4S, 6S and 8S) that covers a cushioning material is typically formed by sewing a plurality of skin pieces in a bag shape. Then, in the present embodiment, the seating side skin material 4S of the seat cushion 4 is formed of a fabric material 10 (described in detail later) that includes conductive wire materials 20 (see FIG. 17). In a first example embodiment of the third embodiment, a skin piece 4SP is made from the fabric material 10 (upstream process), and then the conductive member 18 is electrically connected to the conductive wire materials 20 (see FIG. 17 to FIG. 18C).

First Process: A heating device is used to melt or burn the main fiber materials to remove the main fiber materials (fabric pieces 10e, described later) from the fabric material 10 while leaving the connected portions 22 of the conductive wire materials 20. Second Process: Each conductive member 18 is electrically connected to the connected portion(s) 22 (multiple or single) of the exposed conductive wire materials 20.

In the upstream process, the conductive wire materials 20 and the main fiber materials are used to create the fabric material 10. The fabric material 10 may be any one of a woven fabric, a knit fabric, a nonwoven fabric and a braided rope (braid). A method of making the fabric material 10 in detail will be described later. As will be described later, when the fabric material 10 forms the skin material 4S, the pad material 14 or the backing fabric 16 may be used where appropriate. Hereinafter, the components will be described.

The main fiber material is more inflammable or more meltable than the conductive wire material 20 (described later), and may be used as the main component of the fabric material 10. Then, the main fiber material desirably has a lower melting point than the conductive wire material 20 or has a limiting oxygen index (LOI) smaller than 26. Here, the limiting oxygen index (LOI) is the index of concentration of oxygen ($O_2$%) calculated from a minimum oxygen amount required for a wire material, such as an insulating fiber, to keep burning. The limiting oxygen index (LOI) may be measured in conformity with "JIS K7201 Oxygen index flammability test method for polymeric materials" or "JIS L1091 (1999) 8.5 E-2 method (oxygen index test method)".

The material of the main fiber material may be, for example, a plant or animal natural fiber, a chemical fiber made of thermoplastic resin or thermosetting resin, or a blended fiber of them. These fibers are insulating fibers having a resistivity that exceeds 108 Ω·cm. Then, a wire material (wire material, such as spun yarn, filament, drawn yarn and elastic yarn (false twisted yarn or buckle yarn)) made of insulating fibers may be used as the component of the fabric material 10. Then, a general natural fiber mostly has an LOI smaller than 26. For example, cotton has an LOI of 18 to 20, and wool has an LOI of 24 to 25. Note that, in the natural fiber, cotton, hemp or wool is excellent in texture, so cotton, hemp or wool is desirably used as the component of the fabric material 10.

In addition, a general chemical fiber mostly has a lower melting point than a conductive fiber. Then, the chemical fiber having an LOI smaller than 26 may be, for example, polyester (LOI: 18 to 20) or nylon (LOI: 20 to 22). In addition, in the chemical fiber, a polyester fiber and a polyethylene fiber (for example, filaments of polyethylene terephthalate) are excellent in durability, lightfastness and strength, so a polyester fiber or a polyethylene fiber are desirably used as the component of the fabric material 10.

Each conductive wire material 20 is able to conduct current, and typically has a resistivity of $10^0$ to $10^{-12}$ Ω·cm. The "resistivity (volume resistivity)" is a physical property value that is used to make a comparison on what material is hard to conduct electricity, and may be measured, for example, in conformity with "JIS K-7194". By attaching the conductive wire materials 20 to the fabric material 10, the fabric material 10 itself may be used as electrodes of a capacitance sensor or a heater. The above described conductive wire material 20 may be, for example, a metal wire (conductive thread, such as metal and alloy), a filament of a carbon fiber or a plated wire material (described later). In addition, the main fiber material may be twisted onto (cover) the conductive wire material 20. Here, the carbon fiber is a polyacrylonitrile-based carbon fiber (PAN-based carbon fiber) or a pitch-based carbon fiber. Among others, a carbon fiber having a firing temperature of 1000° C. or above (a carbonized fiber, a graphitized fiber or a graphite fiber) has a high electroconductivity, so the carbon fiber may be suitably used as the conductive wire material 20 according to the present embodiment.

The material of the metal wire may be, for example, gold, silver, copper, brass, platinum, iron, steel, zinc, tin, nickel, stainless steel, aluminum or tungsten. Among others, the metal wire made of stainless steel is excellent in corrosion resistance and strength, so the metal wire may be suitably used as the conductive wire material 20 according to the present embodiment. Here, steel grade is not specifically limited; however, SUS No. 304, SUS No. 316 and SUS No. 316L may be used, for example. SUS No. 304 has a high general versatility. SUS No. 316 and SUS No. 316L contain molybdenum, so they are excellent in corrosion resistance.

Here, the diameter of each metal wire is not specifically limited; however, in consideration of strength and flexibility, a metal wire having a diameter of 10 to 150 µm is desirably used. Note that, as the wire diameter of each metal wire reduces, each conductive wire material 20 is more excellent in flexibility. Then, covered yarn for which metal wires (sheath yarn) cover core yarn of the main fiber material in S twist or Z twist direction may be used as the conductive wire material 20. That is, when a metal wire (conductive thread, or the like) having a thin diameter is excellent in flexibility but is insufficient in tensile strength, for example, a polyester filament is used as core yarn and a metal wire covers the core yarn in S twist or Z twist direction as sheath yarn to thereby make it possible to enhance tensile strength.

In addition, each conductive wire material 20 desirably has a metal wire (core portion) and a sheath portion formed of a resin layer. That is, a thin metal wire (conductive thread, or the like) has a wide surface area, and is greatly susceptible to rust. Thus, the metal wire is desirably coated with resin. In terms of ease of coating, durability, and ease of removal at the connecting portion, resin coating is desirable. The resin may be, for example, urethane, acrylic, silicon or polyester, and is not specifically limited; however, polyurethane is desirable in terms of durability. In addition, the thickness of coating (resin layer) may be selected depending on a type of polymer, durability or applications. The thickness of coating may be, for example, set to about 0.05 to 500 µm. A coating method is not specifically limited; however, the coating method is desirably such that a metal wire is immersed in polymer dispersion liquid to make polymer to adhere to the metal wire and then the adherent polymer is cured by heating. Alternatively, it is also applicable that polymer powder or polymer melt is caused to adhere to a metal wire and then the adherent polymer powder or polymer melt is cured by heating, or the like. Then, the resin coating on the metal wire is removed through melting or burning by the heating device (described later) according to the present embodiment to thereby make it possible to expose the connected portions 22 of the conductive wire materials 20.

Then, each conductive wire material 20 according to the present embodiment has a higher melting point than the main fiber material or has a limiting oxygen index (LOI) larger than or equal to 26. A conductive thread, such as metal and alloy, typically has a higher melting point than a natural fiber or a synthetic fiber. In addition, a conductive thread, such as metal and alloy, typically has an LOI larger than or equal to 26 (for example, a stainless fiber has an LOI of 49.6). Then, the carbon fiber (a PAN-based carbon fiber and a pitch-based carbon fiber) is not meltable, and has an LOI larger than or equal to 60.0.

Then, the plated wire material has a nonconductive or conductive wire material (core portion) and a plated portion made of metal or alloy. The plated portion is formed to thereby make it possible to make the nonconductive wire material be conductive. In addition, by forming the plated portion on the conductive wire material, the durability of the conductive wire material may be improved. The nonconductive wire material (core portion) may be, for example, a para-aramid fiber (LOI: 29), a meta-aramid PBO fiber (LOI: 68), a polyacrylate fiber (LOI: 28), a PPS fiber (LOI: 34), a PEEK fiber (LOI: 33), a polyimide fiber (LOI: 36), a glass fiber, an alumina fiber, a silicon carbide fiber and a boron fiber.

In addition, the plated portion may be formed on the whole or part of the surface of each core portion. A method of forming the plated portion (electroless plating, electroplating, or the like) may be appropriately selected depending on the material of the core portion. The metal used for plating may be, for example, tin (Sn), nickel (Ni), gold (Au), silver (Ag), copper (Cu), iron (Fe), lead (Pb), platinum (Pt), zinc (Zn), chromium (Cr), cobalt (Co) or palladium (Pd). In addition, the alloy used for plating may be, for example, Ni—Sn, Cu—Ni, Cu—Sn, Cu—Zn or Fe—Ni.

Figure 18A:
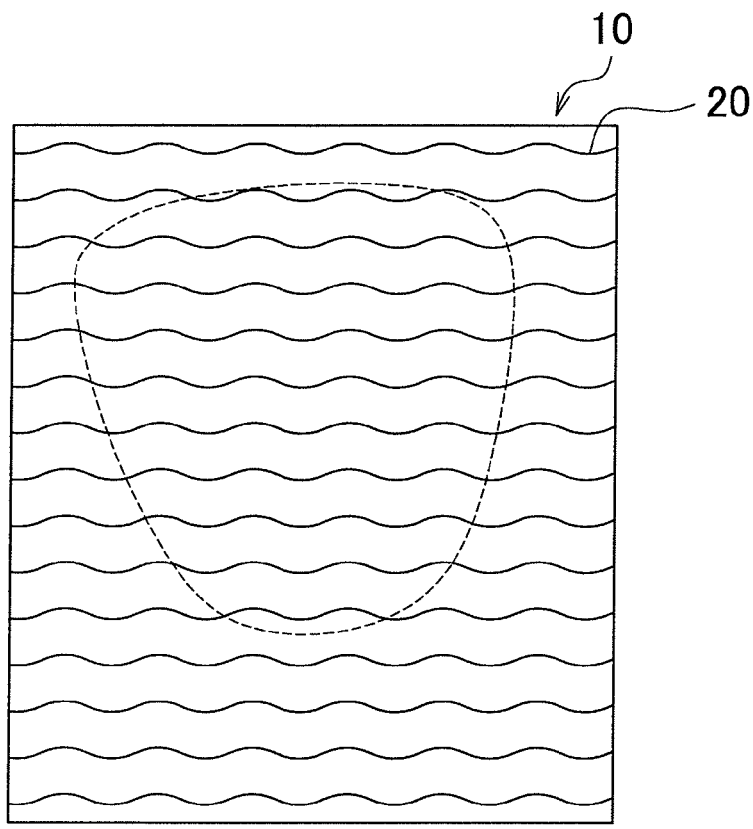
FIG. 18A to FIG. 18C are schematic front views of a fabric material according to a first example embodiment of the third embodiment in a manufacturing process.
Figure 18B:
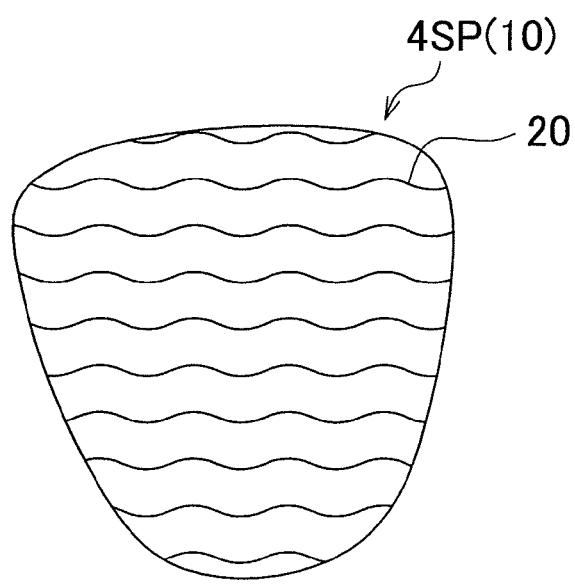
Figure 18C:
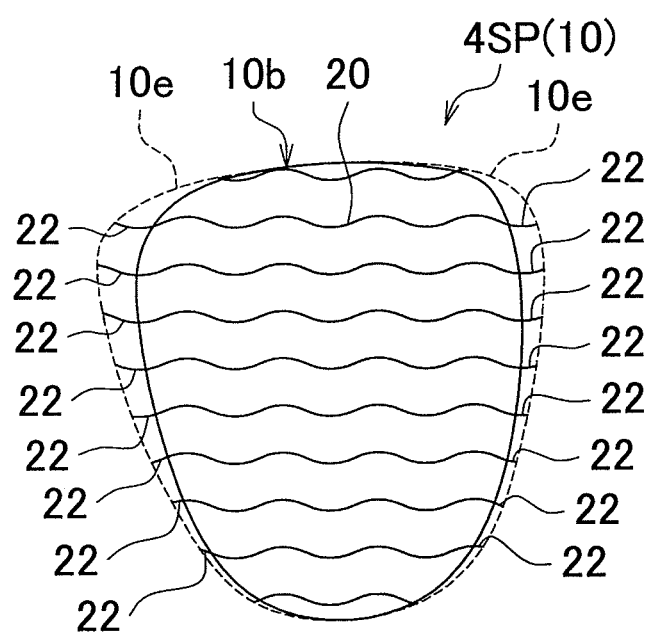

In the third embodiment, part of the fabric material 10 is formed of the conductive wire materials 20, and the other part of the fabric material 10 is formed of the main fiber materials (see FIG. 18A to FIG. 18C). Here, the fabric material 10 may be any one of a woven fabric, a knit fabric, a nonwoven fabric and a braided rope (braid). For example, a woven fabric, or the fabric material 10, may be any woven fabric, such as a plain weave fabric, a twill weave fabric and a satin weave fabric. In addition, a knit fabric, or the fabric material 10, may be any knit fabric, such as a warp knit fabric, a circular knit fabric and a weft knit fabric. Then, a nonwoven fabric, or the fabric material 10, may be any nonwoven fabric that is manufactured by any web forming technique and any web joining technique.

Then, when a woven fabric, or the fabric material 10, is made, part or whole of the weft yarn (warp yarn) may be formed of the conductive wire materials 20, and the remaining weft yarn and warp yarn may be formed of the main fiber materials. For example, each conductive wire material 20 (as weft yarn) may be battened every plurality of or single main fiber material (as weft yarn). In addition, each conductive wire material 20 (as warp yarn) may be arranged in every plurality of or single main fiber material (as warp yarn). Furthermore, in the above described case, the conductive wire materials 20 more than those on the front surface side (seating side) may be desirably arranged on the back surface side of the fabric material 10. For example, by using a twill weave fabric, a great majority of the conductive wire materials 20 (weft yarn) may be arranged on the back surface of the fabric material 10. In this way, the conductive wire materials 20 are not exposed on the front surface side (seating surface) of the fabric material 10 as much as possible. By so doing, it is possible to improve the durability of the conductive wire materials 20 against friction and wear.

In addition, when a knit fabric, or the fabric material 10, is made, it is not limited to warp knitting or weft knitting; the conductive wire materials 20 are used for part of component yarn, and the main fiber materials are used for the other component yarn. Then, in the case of braided rope (a fabric material made of only warp yarn), the conductive wire materials 20 may be used for part of the warp yarn.

In addition, the conductive wire materials 20 are stuck to the back surface of a woven fabric, a knit fabric or a nonwoven fabric to thereby make it possible to make the fabric material 10 according to the present embodiment. A sticking method is not specifically limited; however, it may be, for example, a method, such as stitch bonding (sewing), such as stitchwork and patchwork, chemical bonding using an adhesive agent and thermal bonding using a polymer having a low melting point.

Then, when the fabric material 10 forms the skin material 4S, the plurality of conductive wire materials 20 are desirably arranged parallel to one another (see FIG. 17). For example, when a heater function is imparted to the fabric material 10, the interval (W1) between the adjacent conductive wire materials 20 may be set to range from 1 mm to 60 mm. Alternatively, when a sensor (electrode) function is imparted to the fabric material 10, the interval (W1) between the adjacent conductive wire materials 20 is desirably set to be 60 mm or below. If the interval (W1) between the adjacent conductive wire materials 20 exceeds 60 mm, the sensor function of the fabric material 10 deteriorates (capacitance decreases), so there is a concern that the conductive wire materials 20 do not function as electrodes. Desirably, by setting the upper limit of the interval (W1) between the adjacent conductive wire materials 20 at 30 mm, the fabric material 10 has a further suitable sensor function (capacitance).

The skin material 4S is typically formed of a plurality of skin pieces. In the present embodiment, the fabric material 10 is used for the skin piece 4SP that forms the seating surface of the skin material 4S. Then, when the fabric material 10 is used for the skin material 4S, it is desirable that backing is provided for (a resin layer is formed on) the back surface of the fabric material 10 or the pad material 14 or the backing fabric 16 is arranged on the back surface of the fabric material 10 in consideration of seating performance of the seat (see FIG. 17). The pad material 14 of this type is a flexible porous member, and may be, for example, an urethane pad having a high air content or a slab urethane foam made of a flexible urethane foam. In addition, the backing fabric 16 may be, for example, formed of woven and knit fabrics or a nonwoven fabric (main fiber materials). Then, the fabric material 10, the pad material 14 and the backing fabric 16 are desirably stacked in the stated order and integrated by a joining method and then cut into a predetermined shape (formed into the skin piece 4SP). The joining method may be, for example, laminating (welding), sewing, bonding, or the like.

In the first process, the heating device (not shown, described later) is used to remove part of the main fiber materials through melting or burning to thereby expose the connected portions 22 of the conductive wire materials 20 (see FIG. 18). At this time, it is desirable that, by appropriately setting the temperature or output of the heating device, the main fiber materials are burned (melted) without burning (melting) or breaking the conductive wire materials 20 as much as possible.

The above described heating device may be, for example, a heater (a punch mechanism, a scissors mechanism, or the like) that is physically contactable with the fabric material 10 or an optical heating device, such as a laser. Among others, the laser is able to accurately control temperature (output), so the laser is suitably used as the heating device according to the present embodiment. Here, the type of laser is not specifically limited; however, the layer may be, for example, a $CO_2$ laser, a YAG laser, an excimer laser, a UV laser, a semiconductor laser, a fiber laser, an LD laser or an LD-pumped solid laser. Among others, the $CO_2$ laser is desirable because its laser light is relatively easily absorbed by organic matter (main fiber materials).

In addition, laser light may be irradiated to any of the front and back surfaces of the fabric material 10. When laser light is irradiated to the front surface side of the fabric material 10, it is desirable that laser light is irradiated while the locations of the conductive wire materials 20 are sensed. Among others, laser light is irradiated to the back surface (the pad material 14 or the backing fabric 16) side of the fabric material 10, and then the front surface side of the fabric material 10 is fixed to a fixed surface. By so doing, it is desirable because the focal point of the laser is easily focused on the fabric material 10. In addition, inert gas may be blown to the fabric material 10 while irradiating laser light. The first process is carried out in the atmosphere of inert gas (nitrogen, helium, or the like), so it is possible to suitably prevent or reduce burning (melting) of the conductive wire materials 20.

Then, by appropriately regulating the set temperature, or the like, of the heating device, it is possible to burn (melt) only the main fiber materials while leaving the conductive wire materials 20 or burn (melt) the conductive wire materials 20 (see an alternative embodiment described later). For example, a Mitsubishi $CO_2$ laser processing machine (type: 2512H2, oscillator type: 25SRP, laser rated output: 1000 W) is used as the heating device. At this time, the irradiation conditions of the laser processing machine are set so that the output is higher than or equal to 15 W and lower than 25 W (frequency 200 Hz, processing speed 1500 mm/min). By so doing, the main fiber materials may be burned (melted) while the conductive wire materials 20 are left as much as possible. In addition, the irradiation conditions are set so that the output is higher than or equal to 25 W (frequency 200 Hz, processing speed 500 mm/min). By so doing, the conductive wire materials 20 may be burned (melted) or cut.

Then, in the present embodiment, the heating device is used to melt (burn) only the main fiber materials to thereby form a pair of cut lines at both sides of the fabric material 10 (skin piece 4SP) (see FIG. 18A to FIG. 18C). At this time, the main fiber materials are cut by the heating device; however, the conductive wire materials 20 are not cut but remain unchanged. Then, the fabric piece 10e is separated from the fabric material body 10b to thereby make it possible to expose the side portions (connected portions 22) of the conductive wire materials 20. Note that when the fabric material 10 has the pad material 14 and the backing fabric 16, these pad material 14 and the backing fabric 16 may be cut by the heating device at the same time.

Figure 20A:
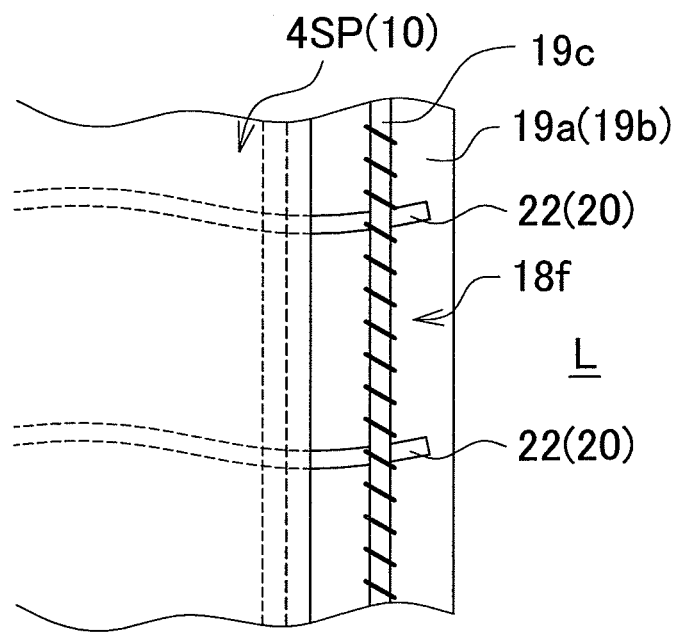
FIG. 20A is a front view of the fabric material.
Figure 20B:
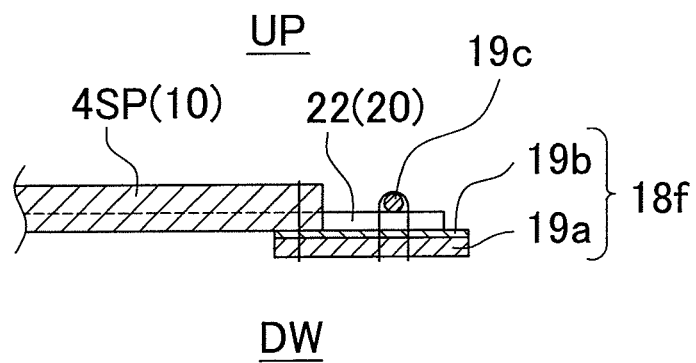
FIG. 20B is a longitudinal cross-sectional view of the fabric material.

In the second process, each conductive member 18 is attached to the connected portions 22 of the exposed conductive wire materials 20 (see FIG. 17, FIG. 20 and FIG. 21). The conductive member 18 is used to supply electric power to the conductive wire materials 20. By so doing, the fabric material 10 may function as electrodes of a sensor or a heater. Here, each conductive member 18 electrically connects the conductive wire materials 20 to a power source, and may be, for example, a belt-like conductive member 18 (a first conductive member 18f, a second conductive member 18s or a third conductive member 18t (described later)) or a linear conductive member 18.

For example, the first conductive member 18f has a belt-like support 19a, a plated layer 19b and a conductor 19c (see FIG. 20). The support 19a according to the present embodiment has a long belt-like shape in a direction in which the conductor 19c is routed (for example, a long belt-like shape in the seat front-rear direction), and may be formed of cloth. In addition, the plated layer 19b has electrically conductive metal or alloy, and is provided on the support 19a. The plated layer 19b may be formed over the entire support 19a or may be formed only on one surface (surface facing the conductive wire materials) of the support 19a. Then, the conductor 19c may be, for example, a conductive thread, such as metal and alloy, or a plated wire material. Note that the conductor 19c may be arranged linearly on the support 19a or may be, for example, arranged in a wavy shape by periodically oscillating the conductor 19c.

Note that the conductor 19c desirably has a lower resistivity than each conductive wire material 20. By setting the electrical resistance of the conductor 19c to be lower than that of each conductive wire material 20, it is possible to prevent or reduce the conductive member 18 from generating heat when conducting current. Here, the resistivity of the conductor 19c may be appropriately set using the resistivity of the conductive wire materials 20. Typically, by setting the resistivity of each conductor 30 so as to range from 1.4 to $15 \times 10^{-8}$ Ω·m, it is possible to prevent or reduce the conductive member 18 from generating heat when conducting current.

Referring to FIG. 17 and FIG. 20, the first conductive members 18f are arranged respectively on both ends of the fabric material 10, and then electrically connected to the connected portions 22 in parallel with each other. At this time, each first conductive member 18f is attached by oversewing each conductor 19c onto the connected portions 22 and each plated layer 19b so that each plated layer 19b and each conductor 19c contact the connected portions 22. Then, by sewing (attaching) each support 19a to the corresponding side portion of the fabric material 10, the relative positional relationship between each first conductive member 18f and the conductive wire materials 20 is suitably maintained to thereby improve electrical connection stability between each first conductive member 18f and the conductive wire materials 20. Then, the terminal of a power cable 9a is connected to each first conductive member 18f to form an electrical circuit of the plurality of conductive wire materials 20 in the fabric material 10. In the present embodiment, the pair of first conductive members 18f are used to form a parallel circuit of the plurality of conductive wire materials 20. Thus, it is possible to conduct current to the plurality of conductive wire materials 20 (generate heat) at a relatively low voltage.

Figure 21A:
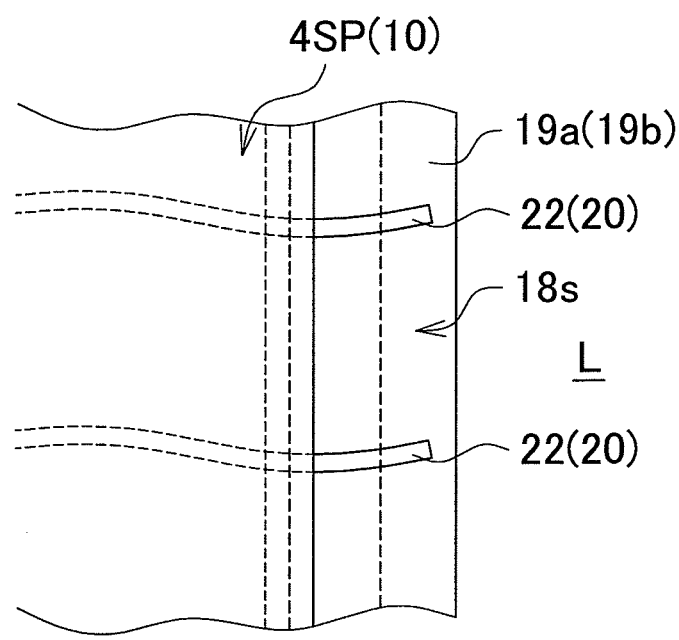
FIG. 21A is a front view of another fabric material according to the first example embodiment of the third embodiment.
Figure 21B:
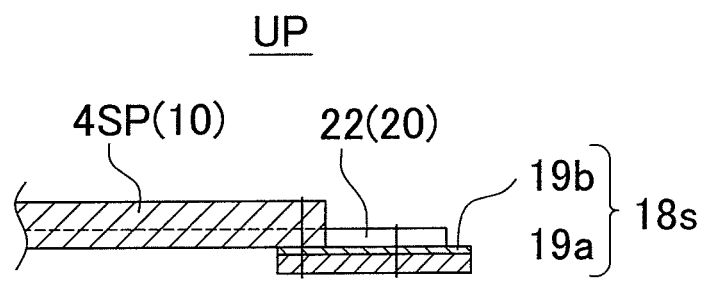
FIG. 21B is a longitudinal cross-sectional view of the fabric material.

In another example, a belt-like support 19a (cloth) and a second conductive member 18s having a plated layer 19b are used (see FIG. 21A and FIG. 21B). Then, the second conductive members 18s are arranged respectively on both ends of the fabric material 10, and then electrically connected to the connected portions 22 in parallel with each other. At this time, each plated layer 19b is brought into contact with the connected portions 22 to attach each second conductive member 18s. That is, each plated layer 19b is sewn onto the connected portion 22 through lock stitch. Then, by sewing (attaching) the support 19s to each side portion of the fabric material 10, the relative positional relationship between each second conductive member 18s and the connected portions 22 is suitably maintained to thereby improve electrical connection stability between each second conductive member 18s and the connected portions 22. In this example, each plated layer 19b is electrically connected to the conductive wire materials 20 in further wide contact area, so it is possible to reduce contact resistance between the conductive wire materials 20 and each conductive member 18.

Incidentally, in the vehicle seat 2, it is required that the conductive wire materials 20 at a portion that contacts an occupant (for example, lower back portion or shoulder portion) are supplied with current, while a portion of the conductive wire materials 20, other than the contact portion, are placed in a nonconductive state. For example, referring to FIG. 19A and FIG. 19B, a skin piece 5SP (fabric material 10) has conductive wire materials at the contact portion (first conductive wire materials 20f) and conductive wire materials at a portion other than the contact portion (second conductive wire materials 20s). Then, in the first process of a first alternative embodiment to the third embodiment, the connected portions 22 of the second conductive wire materials 20s are removed by the heating device through burning or melting to thereby expose only the connected portions 22 of the first conductive wire materials 20f. Then, in the second process, by electrically connecting each conductive member 18 to the first conductive wire materials 20f only, the first conductive wire materials 20f are able to conduct current, while the second conductive wire materials 20s are not able to conduct current. In the first alternative embodiment, by supplying current to only necessary conductive wire materials (first conductive wire materials 20f), it is possible to suppress electric power consumption of the fabric material 10 (heater or sensor) as much as possible.

As described above, in the third embodiment, through the first process and the second process (simple connecting work), the conductive wire materials 20 may be electrically connected to the conductive members 18 without being interfered by the main fiber materials as much as possible. Therefore, according to the present embodiment, the conductive wire materials 20 may, be electrically connected to the conductive members 18 with further good connectivity. In addition, the fabric material 10 functions as electrodes of a capacitance sensor or a heater by supplying current to the conductive wire materials 20, and may be suitably used as the skin material 4S of the vehicle seat 2. Then, in the present embodiment, it is possible to relatively easily remove the second conductive wire materials 20s that is not necessary to be supplied with current while leaving the first conductive wire materials 20f that is necessary to be supplied with current. That is, it is possible to expose only the connected portions of the first conductive wire materials. Therefore, the fabric material 10 according to the third embodiment may function as a heater or a sensor while suppressing electric power consumption as much as possible.

The fabric material 10 according to a second example embodiment of the third embodiment has a substantially similar basic configuration to that of the fabric material according to the first example embodiment. Therefore, like reference numerals denote the corresponding components, and the detailed description is omitted.

Figure 22A:
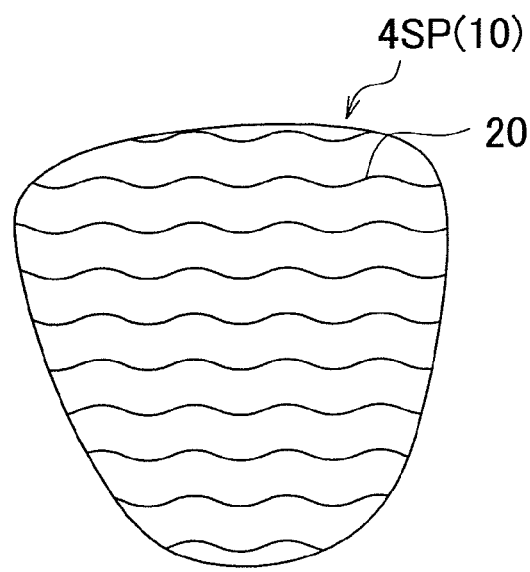
FIG. 22A and FIG. 22B are schematic front views of a fabric material in a manufacturing process according to a second example embodiment of the third embodiment.
Figure 22B:
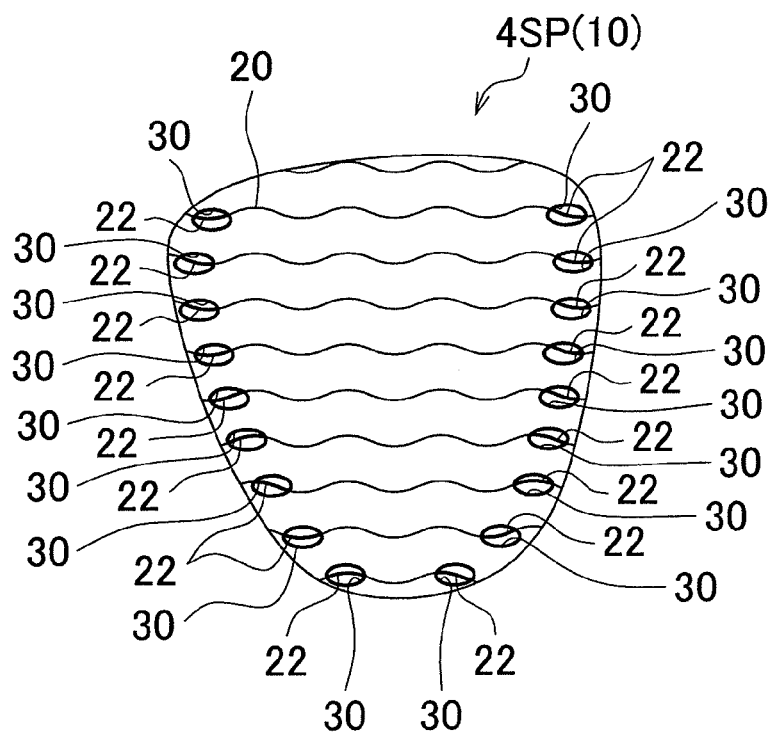
Figure 23A:
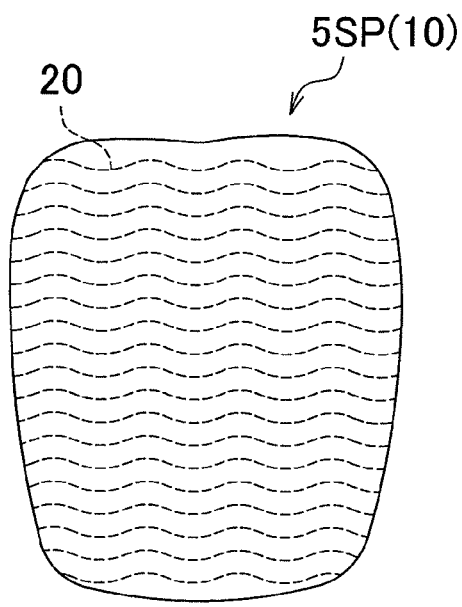
FIG. 23A and FIG. 23B are front views of a fabric material in another manufacturing process according to the second example embodiment of the third embodiment.
Figure 23B:
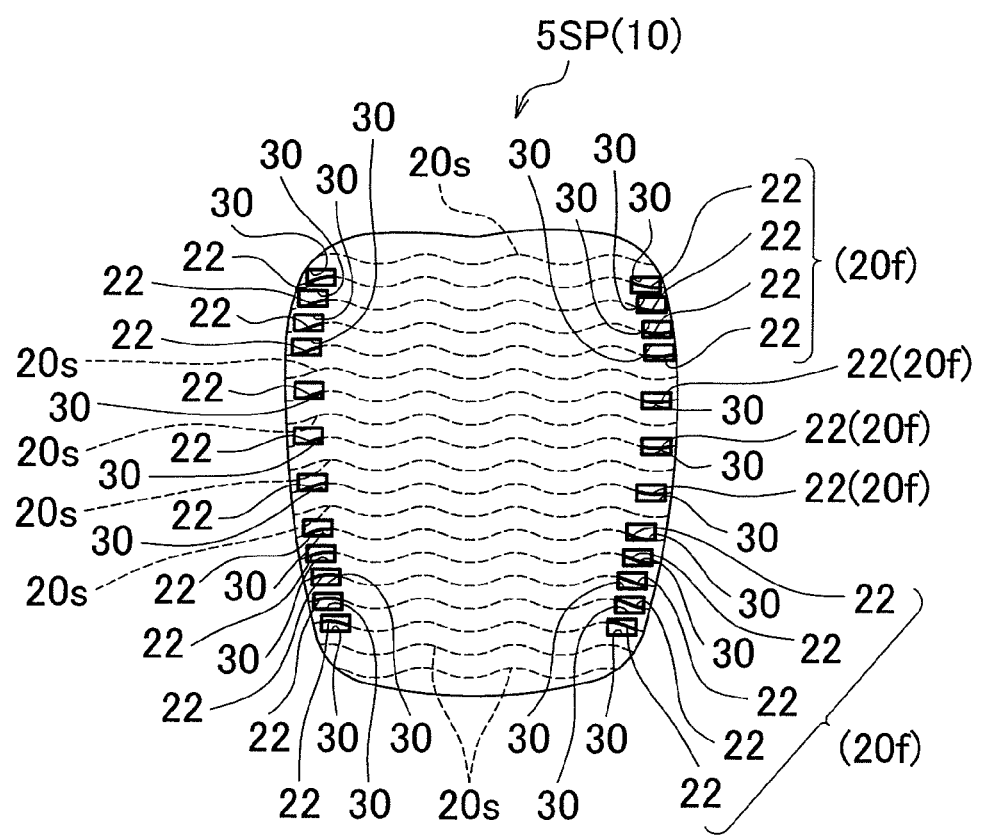
Figure 24A:
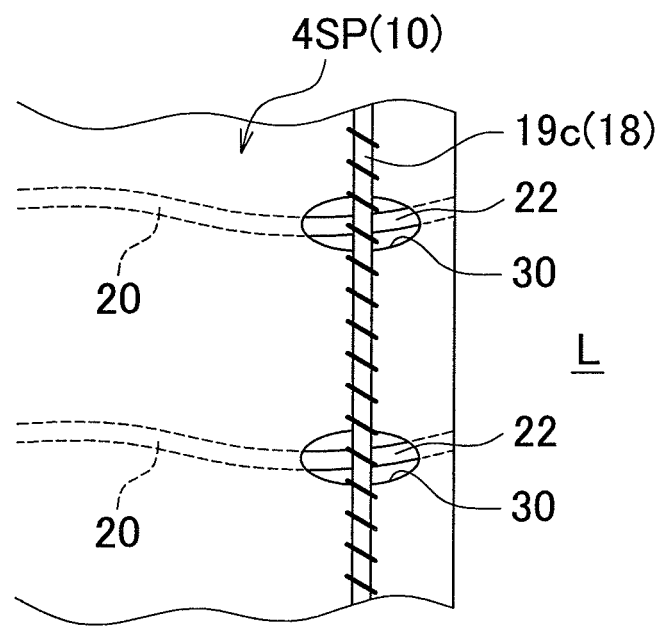
FIG. 24A is a front view of the fabric material according to the second example embodiment of the third embodiment.
Figure 24B:
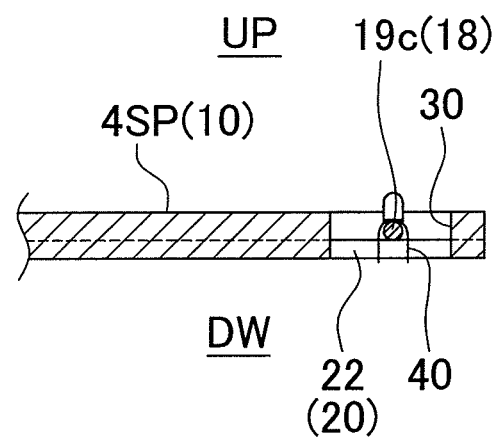
FIG. 24B is a longitudinal cross-sectional view of the fabric material.

In the second example embodiment, the heating device is used to melt or burn the main fiber materials in a spot-like manner to thereby expose the connected portions 22 from holes 30 (closed through-holes) (see FIG. 22A and FIG. 22B). Note that, when the fabric material 10 has the pad material 14 and the backing fabric 16, the holes 30 may be formed to extend through these pad material 14 and the backing fabric 16.

Then, in the first process, all wire materials, or the like, other than the conductive wire materials 20, may be melted or burned. For example, even when the conductive wire materials 20 are covered with yarn or the conductive wire materials 20 have coating layers, the covering yarn or the coating layers may be removed through melting (burning) in the process (the connected portions 22 may be further suitably exposed). In addition, both ends of the connected portions 22 are supported by the fabric material 10, so the connected portions 22 do not curve or twist (the connected portions 22 are hard to cross the other connected portions 22).

Then, in the second process, each conductor 19c (linear conductive member 18) is electrically connected to the connected portions 22 exposed from the holes 30. For example, referring to FIG. 24A and FIG. 24B, each conductor 19c is arranged in the fabric material 10 across the holes 30, and then fixed to the connected portions 22 by fixing members 40. Note that each fixing member 40 may be, for example, a conductive thread or a ring member. Then, each conductor 19c is sewed (attached) onto the fabric material 10. At this time, in the present embodiment, the main fiber materials are maintained as much as possible and the outer shape of the fabric material 10 is also maintained as much as possible, so each conductor 19c may be relatively easily attached to the fabric material 10.

Figure 25A:
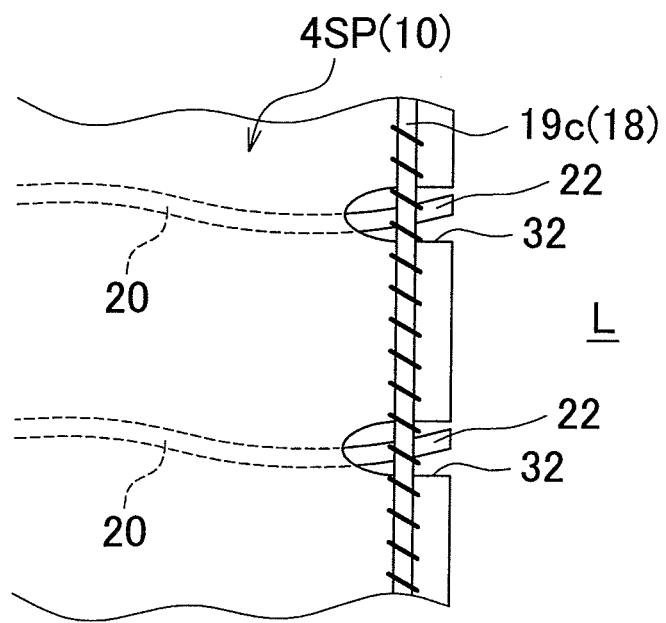
FIG. 25A is a front view of another fabric material according to the second example embodiment of the third embodiment.
Figure 25B:
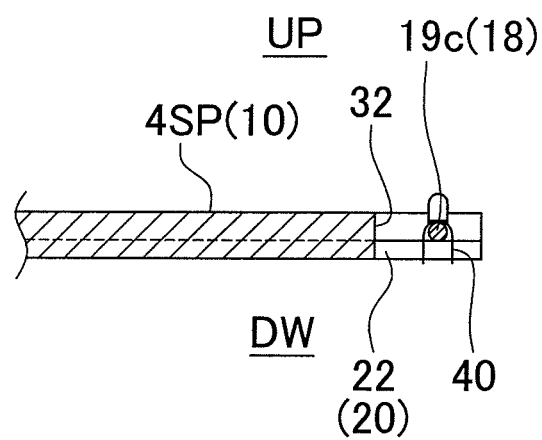
FIG. 25B is a longitudinal cross-sectional view of another fabric material.

In another example, the connected portions 22 are exposed from both ends of the fabric material 10 (see FIG. 25A and FIG. 25B). At this time, the heating device is used to melt or burn the main fiber materials in a spot-like manner to thereby expose the connected portions 22 from cutouts 32 (open through-holes). Then, each conductor 19c is arranged in the fabric material 10 across the cutouts 32, and then fixed to the connected portions 22 by the fixing members 40. Then, each conductor 19c is sewed (attached) onto the fabric material 10. At this time, in this example as well, the main fiber materials are maintained as much as possible and the outer shape of the fabric material 10 is also maintained as much as possible, so each conductor 19c may be relatively easily attached to the fabric material 10. In addition, in this example, each conductor 19c may be oversewed to the side of the fabric material 10. By so doing, it is possible to prevent or reduce fraying of the ends of the fabric material 10 at the same time.

Then, in the vehicle seat 2, as described above, it is required that the conductive wire materials 20 at a portion that contacts an occupant are supplied with current, while a portion of the conductive wire materials 20, other than the contact portion, are placed in a nonconductive state. Then, in the skin piece 5SP according to the present alternative embodiment, referring to FIG. 23A and FIG. 23B, the connected portions 22 of the first conductive wire materials 20f are exposed in a spot-like manner, while the connected portions of the second conductive wire materials 20s are kept unexposed. In this way, in the present embodiment, with further simple work (for example, repeat of irradiation and non-irradiation of laser light), the first conductive wire materials 20f may be exposed, while the second conductive wire materials 20s may be kept unexposed.

The fabric material 10 according to a third example embodiment of the third embodiment has a substantially similar basic configuration to those of the fabric materials according to the first and second example embodiments. Therefore, like reference numerals denote the corresponding components, and the detailed description is omitted. In the third example, third conductive members 18t (hereinafter, simply referred to as the conductive members 18t) each having a support 19a and a conductor 19c are used (see FIG. 26A to FIG. 27). Then, in the present embodiment, a sewing machine (an industrial sewing machine or a home-use sewing machine) is used to sew the support 19a onto the connected portions 22 (sewing lines SEW). At this time, the conductor 19c is used as a sewing thread to thereby electrically connect the conductive wire materials 20 to the conductor 19c.

The support 19a according to the third example embodiment is an elastic belt-like member. Then, the support 19a is fixedly sewed to the fabric material 10 so that the connecting portion does not exert excessive force on the conductive wire materials 20. In addition, as will be described later, the conductor 19c is pressed against the conductive wire materials 20 by the elastic support 19a, so contact stability between the conductor 19c and the conductive wire materials 20 is improved. Then, the support 19a desirably has a predetermined compression characteristic (compressive residual strain, hardness). For example, in the third example embodiment, the hardness of the support 19a may be set to range from 75 to 2000 N, and is desirably set to 100 N or above, and is further desirably set to 200 N or above. In addition, the compressive residual strain of the support 19a may be set to range from 1 to 9% (relatively low value), and is desirably set to 7% or below, and is further desirably set to 5% or below. In this way, by using the support 19a having a low compressive residual strain, contact pressure between the conductive wire materials 20 and the conductor 19c may be suitably increased. Here, the hardness of the support 19a may be measured in conformity with "JIS K6400-2 D". In addition, the compressive residual strain may be measured in conformity with "JIS K6400-4 A".

The material and thickness of the support 19a are not specifically limited. The material of the support 19a may be, for example, rubber (natural rubber, synthetic rubber), elastomer, foamable resin such as slab urethane, bulky nonwoven fabric or bulky woven and knit fabrics. Among others, slab urethane and natural rubber foam have an adequate compression characteristic, and may be easily sewed to the fabric material 10. For example, the support 19a may be slab urethane (type: EMM, thickness: 5.0 mm), slab urethane (type: EL68H, thickness: 4.3 mm) or natural rubber foam (thickness: 5.0 to 10.0 mm).

The conductor 19c desirably has flexibility so as to be usable as a sewing thread. For example, the material of the conductor 19c may be, for example, gold, silver, copper, brass, platinum, iron, steel, zinc, tin, nickel, stainless steel, aluminum or tungsten. Among others, a copper conductor 19c (copper wire) is easily made and less expensive, so it may be suitably used as the conductor 19c according to the third example embodiment. In addition, a plated layer made of the above material may be formed on the conductor 19c. By forming the plated layer on each conductor 19c, the contact resistance between each conductor 19c and the conductive wire materials 20 may be reduced, and the corrosion resistance of each conductor 19c may be improved. Note that the material of the plated layer is not specifically limited; however, a plated layer made of tin or silver, which is less expensive, may be suitably used. In addition, a wire material formed by forming a plated layer on the surface of a main fiber material may also be used as each conductor 19c.

The thickness of each conductor 19c is not specifically limited; however, for example, each conductor 19c desirably has a diameter ranging from 0.01 mm to 2.0 mm. In addition, the conductor 19c (sewing thread) may be a single conductor 19c (single yarn) or twisted yarn formed by twisting a plurality of conductors 19c. For example, when a general sewing needle (sewing needle) is used, twisted yarn formed by twisting 7 to 22 conductors 19c ($\phi$0.05 mm) may be used as a sewing thread. Here, the number of twist of the conductors 19c (twisted yarn) is not specifically limited; however, it desirably ranges from 30 to 200 per meter. Here, when the number of twist is smaller than 30 per meter, the conductors 19c may be loosened during sewing, or the like (the adjacent conductors 19c rub each other to cause the twisted yarn into pieces). Thus, sewing work may take time. In addition, when the number of twist is larger than 200 per meter, the contact area between the conductors 19c and the conductive wire materials 20 tends to extremely decrease. Then, by setting the number of twist of the conductors 19c (twisted yarn) at 50 to 150 per meter (pitch: 7 to 10 mm), the contact area between the conductors 19c and the conductive wire materials 20 may be suitably ensured, and loosening of the conductors 19c during sewing may be prevented or reduced.

A method of sewing the conductor 19c (stitch type) is not specifically limited; however, the method may be, for example, lock stitch, chain stitch, hand stitch, multi-thread chain stitch, hem stitch or covering chain stitch. Among others, lock stitch is suitable for the conductor 19c (wire material having a relatively high rigidity). Here, in the lock stitch, two types of sewing threads (needle thread, bobbin thread) are used. The needle thread is a thread set to a sewing needle, and the bobbin thread is a thread passed through a loop of the needle thread. The conductor 19c is used for at least one of these needle thread and bobbin thread. By so doing, a sewing line SEW made by lock stitch may be formed (see FIG. 26A and FIG. 26B). In addition, the conductor 19c is used for any one of the needle thread and the bobbin thread, and the main fiber material 21 may be used for the other one of the needle thread and the bobbin thread (see FIG. 27). At this time, the conductor 19c has a lower elongation and higher rigidity than a general sewing thread (polyester or cotton), so the conductor 19c is desirably used as the bobbin thread. The material and thickness of the main fiber material 21 are not specifically limited; however, nylon or polyester (about thicknesses of 8# and 20#) having excellent strength and durability is desirably used. Note that various industrial sewing machines may be used as a sewing machine. For example, a single-needle lock stitch sewing machine and a double-needle lock stitch sewing machine may be, for example, used as a sewing machine that is able to perform lock stitch.

Figure 26A:
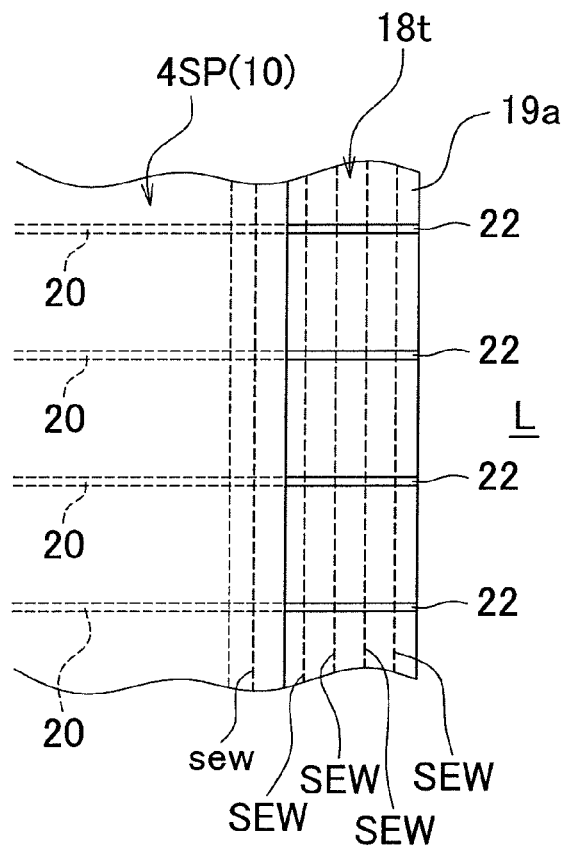
FIG. 26A is a front view of a fabric material according to a third example embodiment of the third embodiment.
Figure 26B:
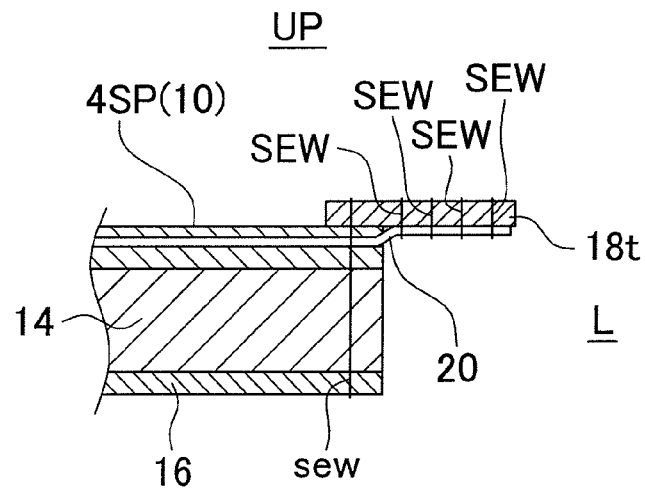
FIG. 26B is a longitudinal cross-sectional view of the fabric material.

A form of the sewing line SEW (the number of lines, stitch pitch, stitch interval, the width of a sewing portion, and a sewing shape) is not specifically limited (see FIG. 26A to FIG. 27). The number of sewing lines SEW may be single; however, in terms of reducing the resistance value of each conductive wire material 20, a plurality of sewing lines SEW are desirably formed on the support 19a (see FIG. 28). In addition, the stitch pitch of the typical sewing line SEW is about 2.0 mm. The stitch interval (interval between the sewing lines) is about 4 mm, and the width of the sewing portion (the arrangement width of the whole of the plurality of sewing lines) is about 20 mm. Then, the stitch interval is, for example, regulated to narrow the width of the sewing portion (through relatively simple work), so each conductive member 18t may be made compact. In addition, the sewing shape of the sewing line SEW in a plan view may be various shapes, such as a linear shape or a meander shape. Among others, each sewing line SEW is formed in a linear shape, so the plurality of sewing lines SEW formed on the support 19a may be made compact.

Referring to FIG. 26A to FIG. 27, the center portion (sewing portion) of the support 19a is arranged to face the connected portions 22. Then, the side portion of the support 19a is sewed to the end of the skin piece 4SP (fabric material 10) (sewing line sew). Subsequently, the sewing threads (21, 19c) are used to attach the center portion (sewing portion) of the support 19a onto the connected portions 22 by lock stitch (sewing line SEW). Then, the conductor 19c is used as the bobbin thread (thread facing the connected portions 22), and the main fiber material 21 is used as the needle thread. By so doing, it is possible to directly bring the conductive wire materials 20 into contact with the conductor 19c. At this time, it is desirable that the tension of the bobbin thread is higher than the tension of the needle thread. This prevents the needle thread from pulling the bobbin thread as much as possible. Therefore, the bobbin thread (conductor 19c) is linearly arranged in side view, so it is possible to increase the contact area between the bobbin thread (conductor 19c) and the conductive wire materials 20. Then, the plurality of linear sewing lines SEW formed on the support 19a are compact. Furthermore, in the third example embodiment, the conductor 19c is pressed against the conductive wire materials 20 by the elastic support 19a, so contact between the conductive wire materials 20 and the conductor 19c is improved. By so doing, it is possible to improve connection stability between the connected portions 22 and each conductive member 18t. That is, it is possible to electrically connect each conductive member 18t to the connected portions 22 of the conductive wire materials 20 with good connectivity.

Here, the pair of conductive members 18t are arranged respectively at two opposite ends of the skin piece 4SP (fabric material 10) (see FIG. 17). At this time, each conductor 19c may be arranged on the outer side of the end (sewing line) of the skin piece 4SP (see FIG. 26A to FIG. 27). By so doing, no uncomfortable feeling is given to an occupant, and the conductive wire materials 20 between both ends (relatively wide area) may be supplied with current. In addition, each conductive member 18t is arranged at the end of the skin piece 4SP (fabric material 10). Thus, a mechanical load on the seat due to an occupant's seating action, or the like, is hard to be exerted on the conductive members 18t (the durability of each conductive member 18t is improved).

Furthermore, in the third example embodiment, the bobbin thread (conductor 19c) drawn out from the support 19a may be directly connected to the ECU or the power source 9 (see FIG. 17). That is, a sewing thread is generally cut at a portion immediate to the terminal of sewing; however, in the third example embodiment, the bobbin thread (conductor 19c) is drawn out from the support 19a by a predetermined length from the end of sewing (see FIG. 26A and FIG. 26B). Then, by binding the plurality of drawn bobbin threads (conductors 19c), the drawn bobbin threads may be inserted and connected to the connector of the ECU or power source 9. That is to say, it is possible to relatively simply arrange the conductive members 18t.

Hereinafter, the third embodiment will be described on the basis of specific examples. Core yarn of carbon fibers ("Torayca (trademark) T300-1K-50A" produced by Toray Industries, Inc.), lower wrap yarn (22 dtex-7 filaments) of nylon 6 and upper wrap yarn of fusible yarn (110 dtex-10 filaments, "Elder (trademark)" produced by Toray Industries, Inc.) were used as a conductive wire material according to a first specific example. Then, SZ twist double covering was applied to the core yarn using the covering yarn (lower wrap yarn) and the fusible yarn (upper wrap yarn) at the number of twist 400 T/m, and then the resultant yarn was used as the conductive wire material according to the first example.

In addition, the warp yarn of colored (ivory) polyethylene terephthalate (PET) false twisted yarn (167 dtex/2-48 filaments), the first weft yarn of colored (ivory) PET false twisted yarn (84 dtex/2-36 filaments) and the second weft yarn of colored (ivory) PET false twisted yarn (470 dtex-96 filaments) were used as yarn that constitutes a fabric material. Then, after the warp yarn was warped, while the first weft yarn and the second weft yarn (weft yarn) were alternately battened (a pattern was represented) by a Jacquard loom, the conductive wire material was battened at a frequency of one per 38 pieces of weft yarn. At this time, the conductive wire material was battened every 8 pieces of warp yarn to thereby arrange the conductive wire materials on the surface of the fabric material at a rate of 1 conductive wire material with respect to 8 pieces of warp yarn. At this time, in consideration of the pattern of the fabric material, the front-side conductive wire materials were arranged between the floating patterns of the warp yarn (recess portions).

Subsequently, known finishing (raising, shearing) was applied to the fabric material, and then a backing agent was applied to the back surface of the fabric material and then dried. Thus, the fabric material according to the first example was obtained. The main components of the backing agent were a flame retardant and an acrylic polymer that is synthesized from butyl acrylate and acrylonitrile. Then, the backing agent was applied at 45 g/m$^2$ at a drying temperature of 150° C. for 1 minute. The finished density of the fabric material was warp/weft=141/2.54 cm/98/2.54 cm. The interval (W1) between the adjacent conductive wire materials was 10 mm. Then, the pad material (thickness 5 mm) of urethane sheet and the backing fabric of half tricot (nylon 6 of 18 dtex) were arranged on the back surface of the fabric material, and then the fabric material, the pad material and the backing fabric were integrated by flame-laminating (the fabric material corresponding to the skin piece was made).

In the first connection example, the conductive wire materials were electrically connected to the conductive members on the basis of the first example embodiment (alternative embodiment) of the third embodiment. A Mitsubishi $CO_2$ laser processing machine (type: 2512H2, oscillator type: 25SRP, laser rated output: 1000 W) was used as the heating device. Then, laser light was irradiated to the fabric material of the first example to cut the piece having a predetermined size from the fabric material for main seat face (see FIG. 18A). The irradiation conditions of the laser at this time were set at a speed of 500 mm/min, an output of 30 W, a duty of 7.7% and a frequency of 200 Hz. Subsequently, laser light was irradiated to the fabric material piece (back surface side) to thereby form a pair of cut lines at both sides (see FIG. 18C). The irradiation conditions of the laser were set at a speed of 1500 mm/min, an output of 20 W, a duty of 7.7% and a frequency of 200 Hz. At this time, the PET yarn (main fiber materials of the fabric material), or insulating fibers, was fused and cut by the heating device; however, carbon fibers (conductive wire materials) were not cut but remained unchanged.

Figure 19A:
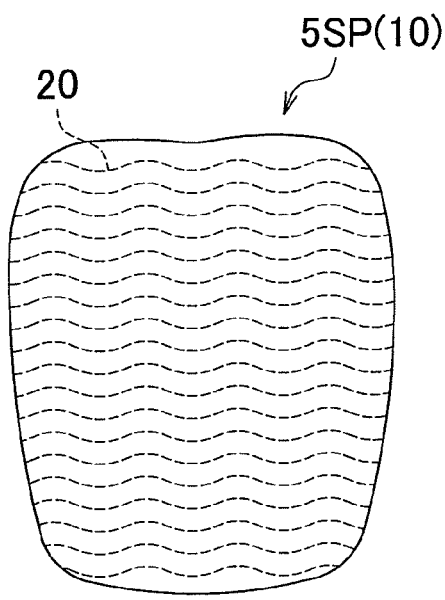
FIG. 19A and FIG. 19B show front views of the fabric material according to the first example embodiment of the third embodiment in another manufacturing process.
Figure 19B:
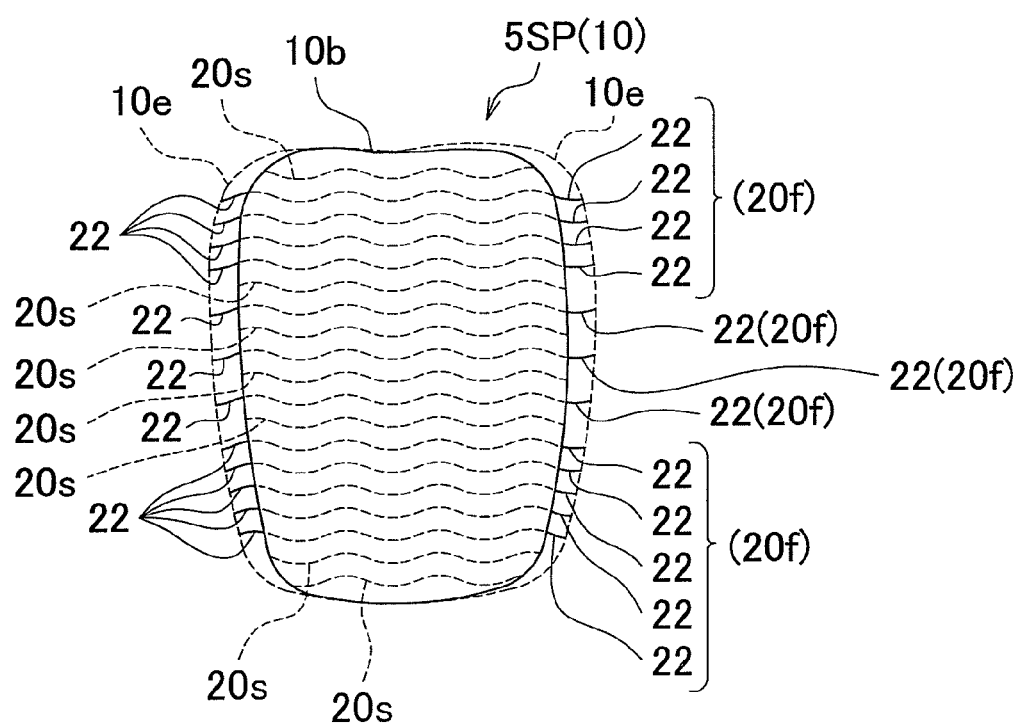

Furthermore, referring to FIG. 19B, conductive wire materials (second conductive wire materials 20s), which are not supplied with current, were selectively made. That is, laser light was selectively irradiated to only specific conductive wire materials 20 while tracing the same lines along which the above described pair of cut lines are formed to thereby form the second conductive wire materials 20s. The irradiation conditions of the laser at this time were set at a speed of 500 mm/min, an output of 30 W, a duty of 7.7% and a frequency of 200 Hz.

Then, the fabric piece was separated from the fabric material piece body to thereby expose the side portions (connected portions) of the conductive wire materials. Then, a nonwoven fabric (support) was sewed to the back surface of the fabric material and then conductors were arranged on the connected portions of the conductive wire materials placed on the nonwoven fabric. After that, the connected portions were sewed to the conductors in close contact with each other (the second conductive members were electrically connected to the connected portions).

In the second connection example, the conductive wire materials were electrically connected to the conductive members on the basis of the second example embodiment. A Mitsubishi $CO_2$ laser processing machine (type: 505GT, oscillator type: 5003D, laser rated output: 0.2 kW, with a galvano head) was used as the heating device. The irradiation conditions of the laser were set at an output of 5.9 W, a frequency of 200 Hz and a pulse width of 12 μsec. Then, laser light was irradiated to the fabric material of the first example to cut the piece having a predetermined size from the fabric material for main seat face (see FIG. 17). Then, the PET (main fiber materials) was melted or burned in a spot-like manner by laser light while the positions of the conductive wire materials were sensed to thereby expose carbon fibers (connected portions) from holes (closed through-holes) (see FIG. 22B). The size of each hole was set to 20 mm in width and 4 mm in length with respect to the direction in which the conductive wire materials are routed. Then, in the holes, the PET yarn (main fiber materials), or insulating fibers, was melted and removed by the heating device; however, carbon fibers (conductive wire materials) were not cut but remained unchanged. Then, the conductors (linear conductive members) were arranged on the connected portions exposed from the holes, and then the conductors and the connected portions were connected to each other by sewing.

Core yarn of stainless (SUS304) fibers (diameter: 12 μm, 100 filaments) and sheath yarn of colored (ivory) PET false twisted yarn (167 dtex/2-48 filaments) were used as a conductive wire material according to a second specific example. "Naslon (trademark)" produced by Nihon electric wire & cable Co., Ltd. was used as the stainless fiber. Then, the core yarn was covered while the number of twist of sheath yarn was set at 200 T/m.

In addition, the warp yarn of colored (ivory) PET false twisted yarn (167 dtex/2-48 filaments), the first weft yarn of colored (ivory) PET false twisted yarn (84 dtex/2-36 filaments) and the second weft yarn of colored (ivory) PET false twisted yarn (470 dtex-96 filaments) were used as yarn that constitutes a fabric material. Then, after the warp yarn was warped, while the first weft yarn and the second weft yarn (weft yarn) were alternately battened (a pattern was represented) by a Jacquard loom, the conductive wire material was battened at a frequency of one per 19 pieces of weft yarn. Then, the fabric material according to the second specific example was made as in the same method as that of the first specific example.

In the third connection example, the conductive wire materials were electrically connected to the conductive members on the basis of the third example embodiment. A Mitsubishi $CO_2$ laser processing machine (type: 2512H2) was used as a laser. Then, laser light was irradiated to the fabric material of the second specific example to cut the piece having a predetermined size from the fabric material for main seat face. The irradiation conditions of the laser at this time were set at a speed of 500 mm/min, an output of 30 W, a duty of 7.7% and a frequency of 200 Hz. Then, laser light was irradiated to the fabric material piece (back surface side) to thereby form a cut line only at one side of the fabric material piece. The irradiation conditions of the laser were set at a speed of 1500 mm/min, an output of 15 W, a duty of 7.7% and a frequency of 200 Hz. At this time, the PET yarn (main fiber materials of the fabric material), or insulating fibers, was melted and cut by the heating device; however, stainless fibers (conductive wire materials) were not cut but remained unchanged.

Subsequently, the conductive members were electrically connected to the connected portions. In this connection example, a PET woven fabric (surface resistance: 0.05 Ω/sq), in which all the surface is plated with copper and nickel through electroless plating, was used as the second conductive member (see FIG. 21A and FIG. 21B). Then, the fabric material and the connected portions were sewed together to electrically connect the connected portions to the second conductive member.

The fabric material according to the second specific example was used as a fabric material according to a third specific example. Then, the pad material (thickness 5 mm) of urethane sheet and the backing fabric of half tricot (nylon 6 of 18 dtex) were arranged on the back surface of the fabric material, and then the fabric material, the pad material and the backing fabric were integrated by flame-laminating. Then, in the same method as that of the third connection example, a pair of cut lines were formed so that the width in the weft yarn direction is 100 mm to thereby expose the side portions (connected portions) of the conductive wire materials from the fabric material.

The third conductive members (support, conductors) were used as the conductive members according to the third specific example. Tin plated copper wires were used as the conductors, and urethane sheet ("HR-90" produced by INOAC Corporation, thickness: 5 mm, compressive residual strain: 3%, hardness: 441N) was used as the support. A twin-needle lockstitch sewing machine (Mitsubishi "LU2-4430") was used as a sewing machine. Then, only one sewing thread was set in the sewing machine and then the side portion of the support was sewed and joined to one end of the fabric material (sewing line sew in FIG. 26A and FIG. 26B). At this time, #8 polyester thread was used as the sewing thread (needle thread and bobbin thread). Then, the center portion of the support was arranged to face the connected portions to thereby arrange the connected portions (conductive wire materials) on the lower side of the support. Subsequently, the center portion of the support was attached to the connected portions by lock stitch (sewing lines SEW in FIG. 26A and FIG. 26B). Then, the conductor was used as the bobbin thread (thread facing the connected portions), and the #8 polyester thread (main fiber material) was used as the needle thread. While slightly displacing the sewing position so that stitches do not overlap each other, the support was sewed four times (four sewing lines SEW were formed).

Sheath yarn of stainless fibers (SUS316, diameter of 50 μm) was used to cover core yarn of PET false twisted yarn (330 dtex-72 filaments) in S twist and Z twist one by one to form a covered thread, and the covered thread was used as a conductive wire material according to a fourth specific example. Note that 3 μm thick urethane coating was applied to the stainless fibers. The conductive wire material according to the second specific example was replaced by the covered thread according to the present example, and then the fabric material according to the fourth specific example was made in a similar method to that of the second specific example. Then, the main fiber materials were removed while leaving the stainless fibers in accordance with the third connection example to thereby electrically connect the conductive member to the connected portions.

An LCR meter (ZM2353) was used as a measuring device that measures the connection resistance of each conductive wire material. Then, the resistance value (n=10) of each conductive wire material located at the opposite side to the conductor sewed at the one end of the fabric material according to the third specific example was measured.

In the fabric material according to the first specific example, almost no conductive wire materials (carbon fibers) were present on the surface of the surface material, and good designability and texture of the fabric material itself were maintained. Then, in the first specific example, in any of the above described first connection example and second connection example, the connected portions of the conductive wire materials were able to be suitably exposed. In addition, in the fabric materials according to the second and fourth specific examples, no conductive wire materials (stainless fibers) were present on the surface of the surface material, and good designability was maintained. Then, in the second and fourth specific examples, in the above described third connection example, the connected portions of the conductive wire materials were able to be suitably exposed. Then, in the third connection example, the relative positional relationship between the conductive member and the connected portions was favorably maintained, and the fabric material was able to function as electrodes of a capacitance sensor. For this reason, according to the first, second and fourth specific examples, it is found that the conductive wire materials may be electrically connected to the conductive members with good connectivity without adversely influencing the seat characteristics as much as possible.

Figure 28:
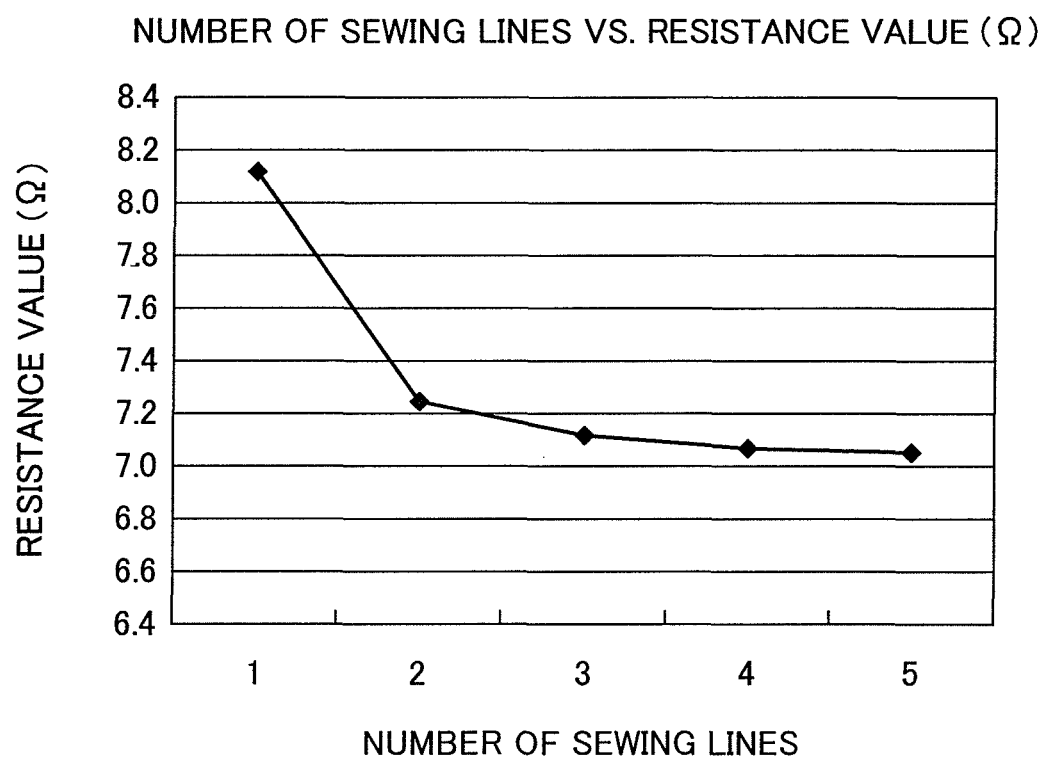
FIG. 28 is a graph that shows the relationship between the number of sewing lines and a resistance value.

Then, in the third specific example, it is found that the measured resistance value decreases with an increase in the number of sewing lines (see FIG. 28). This means that the connection resistance between the conductive wire materials and the conductors decreases with an increase in the number of sewing lines. Then, by setting the number of sewing lines to two or above, the connection resistance between the conductive wire materials and the conductors was able to be effectively decreased.

The woven fabric according to the third embodiment is not limited to the above described embodiments; it may be modified into various forms.

(1) In the third embodiment, the fabric material 10 is used for the skin piece 4SP, or the like. The fabric material may be used as skin materials (for example, 4S, 6S and 8S) of various components of the vehicle seat, such as a seating surface main portion of a seat back, a seating surface side portion of the seat back, an outside portion of the seat back, a back portion of the seat back and the head rest. In addition, other than the vehicle seat, the fabric material may be used as skin materials 4S of various components of a vehicle, such as a ceiling portion, a door portion and a steering wheel. Furthermore, the fabric material 10 may be used as skin materials of seats for furniture and home electrical appliances. In addition, in the present embodiment, the fabric material 10 is provided at a seating surface of the skin material 4S. Instead, the fabric material may be used as a backing fabric.

(2) In addition, in the third embodiment, the conductive wire materials 20 are arranged in the fabric material 10 in a wavy shape. The conductive wire materials 20 may be arranged in a fabric material in various forms, such as in a linear shape and in a zigzag shape.

(3) In the third embodiment, the plurality of conductive wire materials 20 are arranged in the fabric material 10 in the seat width direction in parallel with one another. The arrangement of the plurality of conductive wire materials is not specifically limited; for example, the plurality of conductive wire materials may be arranged in the seat front-rear direction in parallel with one another. In this case, the pair of conductive members are arranged at the front and rear of the seat.

(4) In addition, in the third embodiment, the connected portions are provided at both ends of the conductive wire materials; however, it is not intended to limit the locations of the connected portions.

(5) In addition, in the first connection example, laser light is irradiated twice in order to cut the first conductive wire materials and the second conductive wire materials; however, it is not intended to limit the irradiation conditions of the laser (speed, output, or the like). For example, the irradiation conditions (speed, output, or the like) of the laser are varied depending on portions of the fabric material. By so doing, the first conductive wire materials and the second conductive wire materials may be cut by laser irradiation once.

What is claimed is:

1. A skin material of vehicle interior equipment, comprising:
   a first fabric material including a first conductive wire material and a main fiber material that has a mechanical strength that is weaker than a mechanical strength of the first conductive wire material; and
   a conductive member, which is used to supply electric power to the first conductive wire material, is electrically connected to a portion of the first conductive wire material that is exposed from the first fabric material, wherein
   the conductive member wraps around and covers the exposed portion of the first conductive wire material and is sewn to front and back surfaces of the first fabric material.

2. The skin material of the vehicle interior equipment according to claim 1, wherein the first fabric material includes a fabric material body, a fabric material piece and a split portion provided between the fabric material body and the fabric material piece, the first fabric material includes a plurality of first conductive wire materials that are exposed from the first fabric material at the split portion, both ends of each of the plurality of first conductive wire materials are held by one of the fabric material body and the fabric material piece, and the conductive member is electrically connected to the plurality of first conductive wire materials exposed at the split portion.

3. The skin material of the vehicle interior equipment according to claim 2, wherein the fabric material piece wraps around the conductive member.

4. The skin material of the vehicle interior equipment according to claim 1, further comprising:

a second fabric material that is coupled to the first fabric material to form the skin material of the vehicle interior equipment, wherein the conductive member is connected to an end of the first fabric material, an end surface of the first fabric material is coupled to an end surface of the second fabric material face-to-face to form a coupling portion, and the coupling portion protrudes from a surface of the skin material opposite to the end surface of the first fabric material.

5. The skin material of the vehicle interior equipment according to claim 4, wherein the conductive member has a support member and a conductor, the support member is a woven fabric including a first yarn and a second yarn, the support member extends in a routing direction of the first yarn, and the conductor is routed in a direction generally parallel to the routing direction of the first yarn, and is attached to the support member.

6. The skin material of the vehicle interior equipment according to claim 5, wherein the support member has a conductive portion in which a plurality of conductors are arranged and an attached portion that is attached to the end of the first fabric material, and the attached portion has a mechanical strength that is stronger than a mechanical strength of the conductive portion.

7. The skin material of the vehicle interior equipment according to claim 5, wherein the conductive member has a pressing member that presses the conductor against the conductive wire material.

8. The skin material of the vehicle interior equipment according to claim 2, wherein the fabric material piece is sewn to the conductive member.

9. The skin material of the vehicle interior equipment according to claim 2, wherein the fabric material piece is sewn to front and back surfaces of the fabric material body.

* * * * *